(12) United States Patent
Oshiyama et al.

(10) Patent No.: US 12,107,112 B2
(45) Date of Patent: Oct. 1, 2024

(54) SOLID-STATE IMAGING DEVICE AND ELECTRONIC APPARATUS

(71) Applicant: SONY SEMICONDUCTOR SOLUTIONS CORPORATION, Kanagawa (JP)

(72) Inventors: Itaru Oshiyama, Kanagawa (JP); Shinichiro Noudo, Kumamoto (JP); Yasufumi Miyoshi, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 579 days.

(21) Appl. No.: 17/282,420

(22) PCT Filed: Aug. 20, 2019

(86) PCT No.: PCT/JP2019/032394
§ 371 (c)(1),
(2) Date: Apr. 2, 2021

(87) PCT Pub. No.: WO2020/075391
PCT Pub. Date: Apr. 16, 2020

(65) Prior Publication Data
US 2021/0384250 A1  Dec. 9, 2021

(30) Foreign Application Priority Data

Oct. 11, 2018 (JP) .................... 2018-192693
Apr. 5, 2019 (JP) .................... 2019-073013

(51) Int. Cl.
*H01L 27/146* (2006.01)
*H04N 25/76* (2023.01)

(52) U.S. Cl.
CPC .. *H01L 27/14689* (2013.01); *H01L 27/14623* (2013.01); *H01L 27/14625* (2013.01);
(Continued)

(58) Field of Classification Search
CPC .................................................. H01L 27/1463
See application file for complete search history.

(56) References Cited

U.S. PATENT DOCUMENTS

| | | | |
|---|---|---|---|
| 9,305,947 B2 | 4/2016 | Ihara | |
| 2014/0054662 A1* | 2/2014 | Yanagita | H01L 27/14645 438/73 |

(Continued)

FOREIGN PATENT DOCUMENTS

| | | |
|---|---|---|
| CN | 103403869 | 11/2013 |
| CN | 104882460 | 9/2015 |

(Continued)

OTHER PUBLICATIONS

International Search Report prepared by the Japan Patent Office on Oct. 16, 2019, for International Application No. PCT/JP2019/032394.

(Continued)

*Primary Examiner* — Thanh Luu
(74) *Attorney, Agent, or Firm* — Sheridan Ross PC

(57) ABSTRACT

Groove portions are provided between adjacent photoelectric conversion portions, and sidewall surfaces and bottom surfaces of the groove portions are covered with a first fixed charge film, and open ends of the groove portions are closed by a second fixed charge film with voids inside of the groove portions.

20 Claims, 36 Drawing Sheets

(52) U.S. Cl.
CPC ...... *H01L 27/1463* (2013.01); *H01L 27/1464* (2013.01); *H01L 27/14643* (2013.01); *H04N 25/76* (2023.01)

(56) References Cited

U.S. PATENT DOCUMENTS

| | | | |
|---|---|---|---|
| 2015/0243694 A1 | 8/2015 | Ihara | |
| 2016/0211290 A1* | 7/2016 | Tsai | H01L 27/14689 |
| 2017/0301709 A1 | 10/2017 | Chiang et al. | |
| 2018/0053796 A1* | 2/2018 | Baek | H01L 27/14627 |
| 2018/0301490 A1 | 10/2018 | Dofuku | |

FOREIGN PATENT DOCUMENTS

| | | |
|---|---|---|
| CN | 107155375 | 9/2017 |
| JP | 2012-038981 | 2/2012 |
| JP | 2013-175494 | 9/2013 |
| JP | 2015-162679 | 9/2015 |
| JP | 2016-100347 | 5/2016 |
| JP | 2017-191950 | 10/2017 |
| KR | 20140015326 A | 2/2014 |
| KR | 20160144622 A | 12/2016 |
| TW | 201308585 A | 2/2013 |
| TW | 201727882 | 8/2017 |
| WO | WO-2012117931 A1 | 9/2012 |
| WO | WO-2016080205 A1 | 5/2016 |

OTHER PUBLICATIONS

Official Action (with English translation) for China Patent Application No. 201980059426.5, dated Jun. 5, 2024, 22 pages.

Article 94(3) Communication for Europe Patent Application No. 19871618.5, dated Jul. 18, 2024, 5 pages.

* cited by examiner

SOLID-STATE IMAGING DEVICE AND ELECTRONIC APPARATUS

CROSS REFERENCE TO RELATED APPLICATIONS

This application is a national stage application under 35 U.S.C. 371 and claims the benefit of PCT Application No. PCT/JP2019/032394 having an international filing date of 20 Aug. 2019, which designated the United States, which PCT application claimed the benefit of Japanese Patent Application Nos. 2018-192693, filed 11 Oct. 2018 and 2019-073013, filed 5 Apr. 2019, the entire disclosures of each of which are incorporated herein by reference.

TECHNICAL FIELD

The present technology relates to a solid-state imaging device and an electronic apparatus.

BACKGROUND ART

In recent years, a back-illuminated solid-state imaging device that receives light from a side opposite to a side on which a wiring layer is formed on a substrate has been proposed (see, for example, PTL 1). In the solid-state imaging device described in PTL 1, a groove portion is provided between adjacent photoelectric conversion portions of the substrate, the inside of the groove portion is covered with a fixed charge film, and an insulation film is embedded without any void in order to reduce optical color mixing.

CITATION LIST

Patent Literature

[PTL 1] JP 2017-191950 A

SUMMARY

Technical Problem

In such a solid-state imaging device, further improvement of characteristics such as reduction of optical color mixing is required. An object of the present disclosure is to provide a solid-state imaging device and an electronic apparatus having further improved characteristics such as reduction of optical color mixing.

Solution to Problem

A solid-state imaging device of the present disclosure includes (a) a substrate; (b) a plurality of photoelectric conversion portions formed on the substrate; (c) groove portions provided between adjacent photoelectric conversion portions; and (d) a fixed charge film which covers a sidewall surface and a bottom surface of the groove portions, and a light reception surface side of the substrate and which contains at least one of hafnium, aluminum, zirconium, tantalum, and titanium, wherein (e) at least some of open ends of the groove portions are closed by the fixed charge film with a void left inside the groove portion.

An electronic apparatus of the present disclosure includes (a) a solid-state imaging device including a substrate, a plurality of photoelectric conversion portions formed on the substrate, groove portions provided between adjacent photoelectric conversion portions, and a fixed charge film which covers a sidewall surface and a bottom surface of the groove portions, and a light reception surface side of the substrate and which contains at least one of hafnium, aluminum, zirconium, tantalum, and titanium; (b) an optical lens that forms an image of image light from a subject on an imaging surface of the solid-state imaging device; and (c) a signal processing circuit that performs signal processing on a signal output from the solid-state imaging device, wherein (d) at least some of open ends of the groove portion are closed by the fixed charge film with a void left inside the groove portion.

DESCRIPTION OF EMBODIMENTS

The present inventors have discovered the following problems in the solid-state imaging device described in PTL 1. In the back-illuminated solid-state imaging device described in PTL 1, since a difference between a refractive index of a substrate (for example, 3.9 in the case of silicon (Si)) and a refractive index of an insulation film (for example, 1.4 in the case of being silicon oxide ($SiO_2$)) is small, there is a possibility of sufficient reflection characteristics not being obtained in a groove portion between adjacent photoelectric conversion portions, light being transmitted through the groove portion, and optical color mixing being caused. When a film thickness of a fixed charge film between the substrate and the insulation film is very small, influence on the reflection characteristics is small.

Hereinafter, an example of the solid-state imaging device and the electronic apparatus according to the embodiment of the present disclosure will be described with reference to FIGS. 1 to 26. The embodiments of the present disclosure will be described in the following order. The present disclosure is not limited to the following examples. Further, effects described in the present specification are merely examples and are not limited, and other effects may be obtained.

1. First Embodiment: Solid-state Imaging Device
1-1 Overall Configuration of Solid-state Imaging Device
1-2 Configuration of Main Portions
1-3 Method of Manufacturing Solid-state Imaging Device
1-4 Modification Example
2. Second Embodiment: Solid-state Imaging Device
2-1 Configuration of Main Portions
2-2 Method of Manufacturing Solid-state Imaging Device
2-3 Modification Example
3. Third Embodiment: Electronic Apparatus 1. First Embodiment

[1-1 Overall Configuration of Solid-state Imaging Device]

Figure 1:
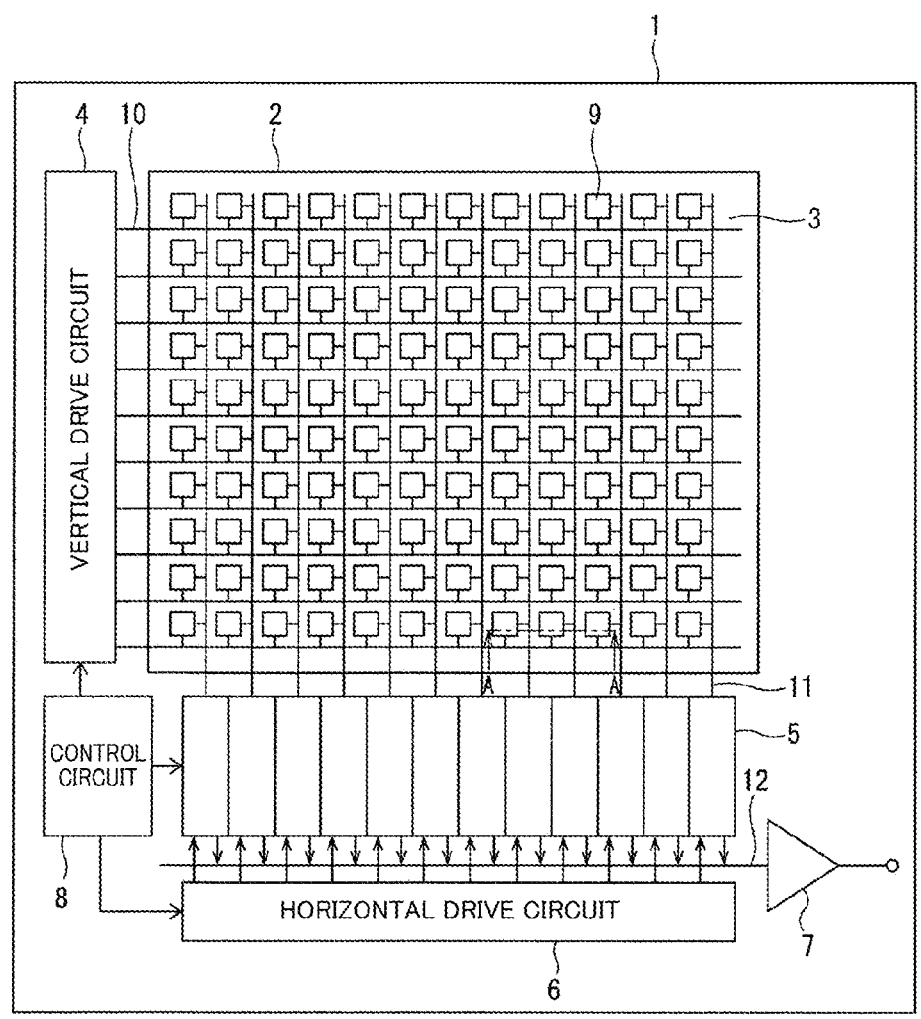
FIG. 1 is a diagram illustrating an overall configuration of a solid-state imaging device according to a first embodiment of the present disclosure.
Figure 26:
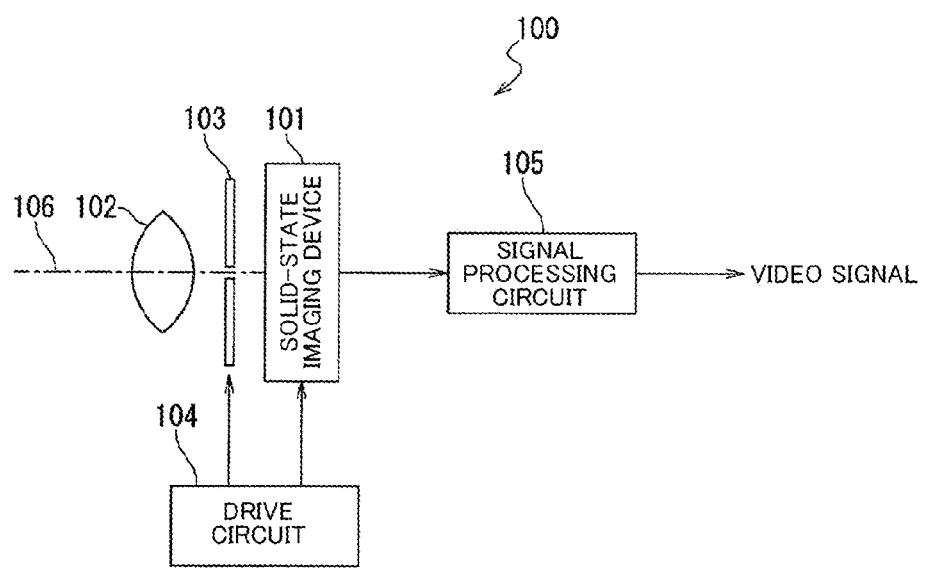
FIG. 26 is a schematic configuration diagram of an electronic apparatus according to a third embodiment of the present disclosure.

FIG. 1 is a schematic configuration diagram illustrating an entire solid-state imaging device according to a first embodiment of the present disclosure. The solid-state imaging device 1 in FIG. 1 is a back-illuminated complementary metal oxide semiconductor (CMOS) image sensor. As illustrated in FIG. 26, the solid-state imaging device 1 (101) captures image light (incident light 106) from a subject through an optical lens 102, converts an amount of incident light 106 formed as an image on an imaging surface to an electrical signal in units of pixels, and outputs the electrical signal as a pixel signal.

The solid-state imaging device 1 of the first embodiment includes a substrate 2, a pixel region 3, a vertical drive circuit 4, a column signal processing circuit 5, a horizontal drive circuit 6, an output circuit 7, and a control circuit 8, as illustrated in FIG. 1.

The pixel region 3 includes a plurality of pixels 9 arranged regularly in a two-dimensional array on the substrate 2. The pixel 9 includes a photoelectric conversion portion 24 illustrated in FIG. 2 and a plurality of pixel transistors (not illustrated). As the plurality of pixel transistors, for example, four transistors such as a transfer transistor, a reset transistor, a selection transistor, and an amplifier transistor can be adopted. Further, for example, three transistors other than the selection transistor may be adopted.

The vertical drive circuit 4 is configured of, for example, a shift register, selects a desired pixel drive wiring 10, supplies a pulse for driving the pixel 9 to the selected pixel drive wiring 10, and drives the respective pixels 9 in units of rows. That is, the vertical drive circuit 4 selectively scans the respective pixels 9 in the pixel region 3 in a vertical direction sequentially in units of rows, and supplies a pixel signal based on signal charge generated by the photoelectric conversion portion 24 of each pixel 9 according to an amount of received light to the column signal processing circuit 5 through the vertical signal line 11.

The column signal processing circuit 5 is disposed in each column of the pixel 9, for example, and performs signal processing such as noise removal for each pixel column on a signal output from the pixel 9 for one row. For example, the column signal processing circuit 5 performs signal processing such as correlated double sampling (CDS) for removing fixed pattern noise unique to the pixel, and analog-to-digital (AD) conversion.

The horizontal drive circuit 6 is configured of, for example, a shift register, sequentially outputs horizontal scanning pulses to the column signal processing circuit 5 to select the respective column signal processing circuits 5 in order, and causes the pixel signal subjected to signal processing to be output from the respective column signal processing circuits 5 to a horizontal signal line 12.

The output circuit 7 performs signal processing on pixel signals sequentially supplied from the respective column signal processing circuits 5 through the horizontal signal line 12 and outputs resultant signals. As the signal processing, for example, buffering, black level adjustment, column variation correction, and various digital signal processing can be used.

The control circuit 8 generates a clock signal or a control signal serving as a reference for an operation of the vertical drive circuit 4, the column signal processing circuit 5, the horizontal drive circuit 6, and the like on the basis of a vertical synchronization signal, a horizontal synchronization signal, and a master clock signal. The control circuit 8 outputs the generated clock signal or control signal to the vertical drive circuit 4, the column signal processing circuit 5, the horizontal drive circuit 6, and the like.

[1-2 Configuration of Main Portions]

Figure 2:
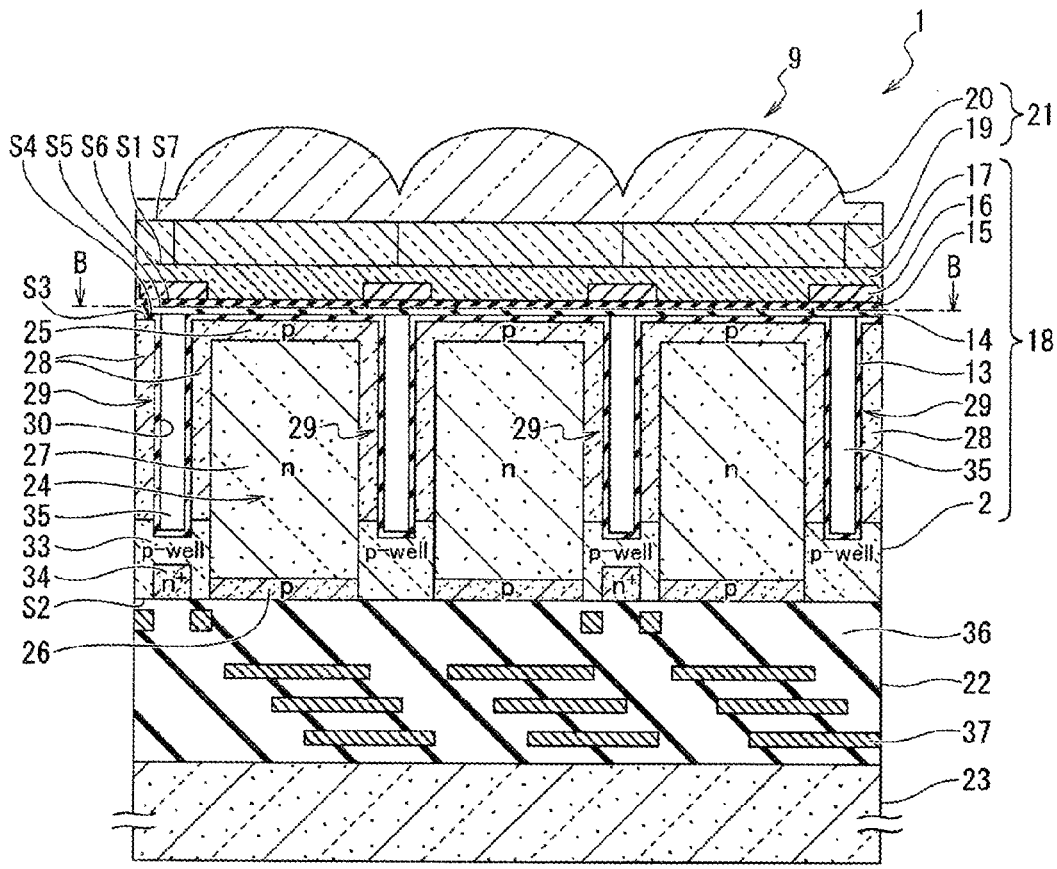
FIG. 2 is a diagram illustrating a cross-sectional configuration of a pixel region taken along line A-A of FIG. 1.

Next, a detailed structure of the solid-state imaging device 1 of FIG. 1 will be described. FIG. 2 is a diagram illustrating a cross-sectional configuration of the pixel region 3 and the like of the solid-state imaging device 1 according to the first embodiment. In FIG. 2, a back-illuminated CMOS image sensor (CMOS type solid-state imaging device) is used as the solid-state imaging device 1.

As illustrated in FIG. 2, the solid-state imaging device 1 of the first embodiment includes a light reception layer 18 in which the substrate 2, a first fixed charge film 13, a second fixed charge film 14, an insulation film 15, a light shielding film 16, and a flattening film 17 are stacked in this order. Further, a condensing layer 21 in which a color filter layer 19 and an on-chip lens 20 are stacked in this order is formed on a surface of the light reception layer 18 on the flattening film 17 side (hereinafter, also referred to as "back surface S1 side"). Further, a wiring layer 22 and a support substrate 23 are stacked in this order on a surface of the light reception layer 18 on the substrate 2 side (hereinafter also referred to as "front surface S2 side"). Further, since the back surface S1 of the light reception layer 18 and a back surface of the flattening film 17 are the same surface, the back surface of the flattening film 17 is also referred to as "back surface S1" in the following description. Further, since the front surface S2 of the light reception layer 18 and the front surface of the substrate 2 are the same surface, the front surface of the substrate 2 is also referred to as "front surface S2" in the following description.

The substrate 2 is configured of, for example, a semiconductor substrate made of silicon (Si), and forms the pixel region 3 as illustrated in FIG. 1. In the pixel region 3, a plurality of pixels 9 including a plurality of photoelectric conversion portions 24 formed (embedded) on the substrate 2 are arranged in a two-dimensional array, as illustrated in FIG. 2. The photoelectric conversion portion 24 includes p-type semiconductor regions 25 and 26 formed on the front surface S2 side and the back surface S3 side of the substrate 2, respectively, and an n-type semiconductor region 27 formed between the p-type semiconductor regions 25 and 26. In the photoelectric conversion portion 24, a photodiode is formed of a pn junction between the p-type semiconductor regions 25 and 26 and the n-type semiconductor regions 27. In the photoelectric conversion portion 24, signal charge according to the amount of incident light is generated, and the generated signal charge is accumulated in the n-type semiconductor regions 27. Further, electrons that cause a dark current generated at an interface of the substrate 2 are absorbed by holes that are majority carriers of the p-type semiconductor regions 25 and 26 formed on the front surface S2 and the back surface S3 of the substrate 2, thereby curbing the dark current.

Figure 3:
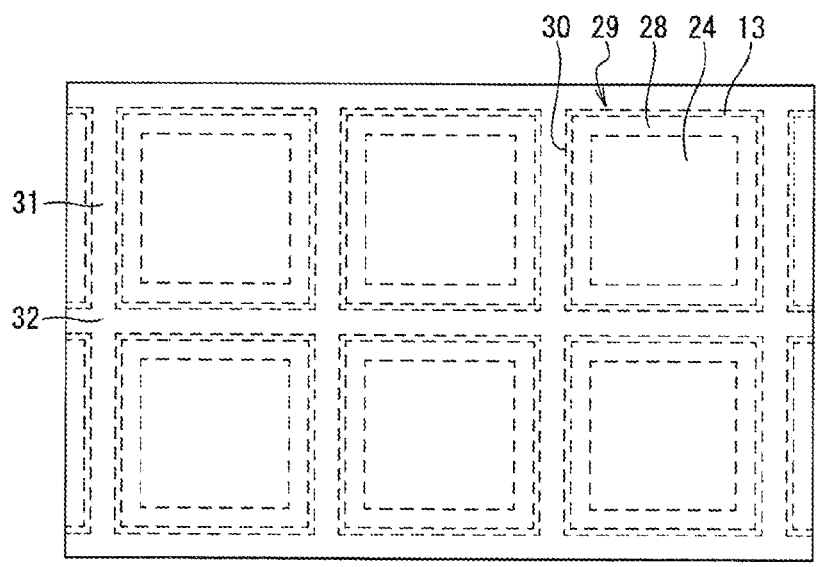
FIG. 3 is a diagram illustrating a planar structure of a groove portion taken along line B-B of FIG. 2.

Further, each photoelectric conversion portion 24 is electrically isolated by a pixel isolation layer 28 formed of a p-type semiconductor region and an element isolation portion 29 formed in the pixel isolation layer 28. The pixel isolation layer 28 and the element isolation portion 29 are formed in a grid pattern to surround each photoelectric conversion portion 24, as illustrated in FIG. 3. The element isolation portion 29 has a groove portion 30 formed in a depth direction from the back surface S3 side of the substrate 2, as illustrated in FIG. 2. That is, the groove portion 30 is engraved and formed between adjacent photoelectric conversion portions 24 on the back surface S3 side of the substrate 2 (the pixel isolation layer 28). The groove portion 30 is formed in a grid pattern configured of a straight portion 31 and an intersection portion 32 to surround each photoelectric conversion portion 24, as illustrated in FIG. 3, like the pixel isolation layer 28 and the element isolation portion 29. The straight portion 31 is a region that isolates two adjacent photoelectric conversion portions 24, and is a portion in which the groove portions 30 do not intersect with each other. Further, the intersection portion 32 is a portion in which the groove portions 30 intersect with each other.

Further, it is preferable for a depth of the groove portion 30 to be, for example, equal to or greater than a depth of reaching a p-well layer 33 on which the pixel transistor is formed and smaller than a depth of reaching a floating diffusion portion 34 or a source/drain region. For example, the depth is set to about 0.25 to 5.0 μm when a depth of the floating diffusion portion 34 or the source/drain region is smaller than 1 μm.

Here, a maximum width of an open end of the intersection portion 32 is usually wider than a maximum width of an open end of the straight portion 31. Further, an open end of the groove portion 30 is closed by the second fixed charge film 14 so that the void 35 remains inside the groove portion 30 using a PVD method or a CVD method, as will be described below. Therefore, it is preferable for a width of an open end of the groove portion 30 (the straight portion 31 and the intersection portion 32) to be a width such that the entire open end of the intersection portion 32 can be closed by the second fixed charge film 14 based on a PVD method or a CVD method. For example, when the maximum width of the intersection portion 32 that can be closed by the second fixed charge film 14 is about 30 nm using the PVD method or the CVD method, the width of the open end of the straight portion 31 is about 20 nm.

The first fixed charge film 13 continuously covers a sidewall surface and a bottom surface of the groove portion 30 and the entirety on the back surface S3 side (the entirety on the light reception surface side) of the substrate 2. A film thickness of the first fixed charge film 13 is a uniform film thickness in which the groove portion 30 is not completely filled so that a space is formed in the groove portion 30. For example, the film thickness is about 15 nm. Accordingly, a groove-shaped space (the void 35) of which a sidewall surface and a bottom surface are surrounded by the first fixed charge film 13 is formed inside the groove portion 30. As a material of the first fixed charge film 13, for example, a high refractive index material film or a high dielectric film having negative charge capable of generating fixed charge and strengthening pinning by being deposited on the substrate 2 can be used. Specifically, an oxide, a nitride, or the like containing at least one element among hafnium (Hf), aluminum (Al), zirconium (Zr), tantalum (Ta), and titanium (Ti) can be adopted. For example, it is preferable for a material corresponding to the damage of the substrate 2 due to etching at the time of forming the groove portion 30 to be used. In particular, hafnium oxide ($HfO_2$) that can curb the generation of blisters by being deposited on the substrate 2 and is unlikely to peel off from a plane portion of the substrate 2 is more preferable.

Further, as the material of the first fixed charge film 13, for example, an oxide or a nitride containing at least one element among lanthanum (La), praseodymium (Pr), cerium (Ce), neodymium (Nd), promethium (Pm), samarium (Sm), europium (Eu), gadolinium (Gd), terbium (Tb), dysprosium (Dy), holmium (Ho), samarium (Tm), ytterbium (Yb), lutetium (Lu), and yttrium (Y), in addition to the above materials, can also be used.

Further, as a method for forming the first fixed charge film 13, for example, an atomic layer deposition method (hereinafter also referred to as "ALD method") and a chemical vapor deposition method (hereinafter also referred to as "CVD method") can be used. In particular, it is more preferable to adopt the ALD method in consideration of forming a uniform film on the groove portion 30 having a high aspect ratio.

Thus, in the first embodiment, since the first fixed charge film 13 having negative charge is formed on the sidewall surface and the bottom surface of the groove portion 30 and the entirety on the back surface S3 side of the substrate 2, an inversion layer is formed on a surface that is in contact with the first fixed charge film 13. Accordingly, a silicon interface is pinned by the inversion layer and thus, a dark current is curbed. Further, when the groove portion 30 is formed on the substrate 2, physical damage is likely to occur on the sidewall surface and the bottom surface of the groove portion 30, and pinning-out is likely to occur in a peripheral portion of the groove portion 30. In response to this problem, in the first embodiment, the first fixed charge film 13 having a fixed charge is formed on the sidewall surface and the bottom surface of the groove portion 30, thereby preventing pinning-out.

Further, in the first embodiment, since the groove-shaped void 35 of which a sidewall surface and a bottom surface are surrounded by the first fixed charge film 13 is formed in the groove portion 30, adjacent photoelectric conversion portions 24 are more reliably electrically isolated.

The second fixed charge film 14 closes the open end of the groove portion 30, and continuously covers the entirety on the back surface S4 side (the entirety on the light reception surface side) of the first fixed charge film 13. A film thickness of the second fixed charge film 14 is set to, for example, about 45 nm in order to more reliably close the open end of the groove portion 30. Accordingly, the inside of the groove portion 30 is closed with a void 35 (so-called void) left. That is, the element isolation portion 29 has a hollow structure having a void 35. The inside of the void 35 may be filled with air or may be in a vacuum state.

Figure 4:
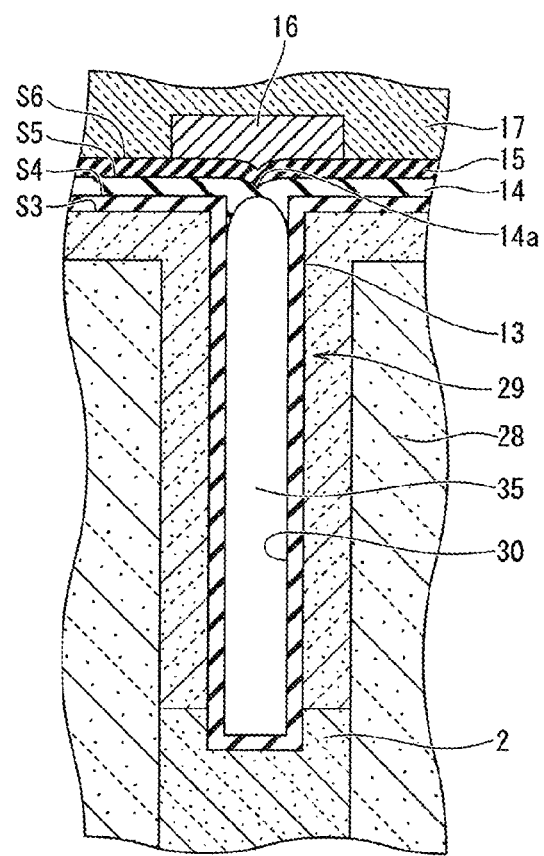
FIG. 4 is an enlarged view of main portions illustrating an enlarged cross-sectional structure of an element isolation portion.

More specifically, a part of the second fixed charge film 14 enters the groove portion 30 so that the sidewall surface on the open end side of the groove portion 30 is covered, as illustrated in FIG. 4. The film thickness of the second fixed charge film 14 which covers the sidewall surface on the open end side of the groove portion 30 is larger on the open end side of the groove portion 30 than on the back side (bottom surface side). Accordingly, the second fixed charge film 14 has a shape protruding toward an inner wall surface of the groove portion 30 from a center in a width direction of the open end, and the open end of the groove portion 30 is closed by the second fixed charge film 14. Further, a depressed portion 14a extending along the groove portion 30 and formed in a grid pattern is provided on a surface of the second fixed charge film 14 on the back surface S5 side (light reception surface side).

As a material of the second fixed charge film 14, for example, a high refractive index material film or a high dielectric film having negative charge capable of generating fixed charge and strengthening pinning by being deposited on the substrate 2 can be used. Specifically, an oxide, a nitride, or the like containing at least one element among hafnium (Hf), aluminum (Al), zirconium (Zr), tantalum (Ta), and titanium (Ti) can be adopted. For example, a material corresponding to damage of the substrate 2 may be used. In particular, aluminum oxide ($Al_2O_3$) that strengthens pinning of the groove portion 30 is more preferable.

Further, as a method of forming the second fixed charge film 14, for example, a physical vapor deposition method (hereinafter also referred to as "PVD method") or a CVD method can be used. In particular, considering that it is difficult for a hafnium oxide or the like to enter the groove portion 30 and the open end of the groove portion 30 is closed, it is more preferable to adopt the PVD method in which coverage of the sidewall surface and the bottom surface is poor.

The insulation film 15 continuously covers the entirety on the back surface S5 side (the entirety on the light reception surface side) of the second fixed charge film 14. As a material of the insulation film 15, for example, an oxide film having a refractive index different from that of the second fixed charge film 14 can be adopted. Specifically, at least one of silicon oxide ($SiO_2$), silicon nitride ($Si_3N_4$), and silicon oxynitride (SiON) can be adopted. As the material of the insulation film 15, for example, a material having no positive fixed charge and a material having less positive fixed charge are preferable.

The light shielding film 16 is formed in a grid pattern to open light reception surfaces of the plurality of photoelectric conversion portions 24 to a part of the insulation film 15 on the back surface S6 side (a part on the light reception surface side). That is, the light shielding film 16 is formed at a position overlapping the groove portions 30 formed in a grid pattern when the light reception layer 18 is viewed from the back surface S1 side. As a material of the light shielding film 16, for example, a material capable of shielding light can be adopted. Specifically, aluminum (Al), tungsten (W), copper (Cu) and the like can be adopted. The flattening film 17 continuously covers the entirety on the back surface S6 side (the entirety on the light reception surface side) of the insulation film 15 including the light shielding film 16. Accordingly, the back surface S1 of the light reception layer 18 is a flat surface without unevenness. As a material of the flattening film 17, for example, an organic material such as a resin can be used.

The color filter layer 19 is formed on the back surface S1 side (light reception surface side) of the flattening film 17 in correspondence to a wavelength of light to be received by each pixel 9 such as R, G, and B. The color filter layer 19 transmits light having a specific wavelength, and causes the transmitted light to be incident on the photoelectric conversion portion 24 in the substrate 2.

The on-chip lens 20 is formed on the back surface S7 side (light reception surface side) of the color filter layer 19 in correspondence to each pixel 9. The on-chip lens 20 collects the irradiation light, and causes the collected light to be efficiently incident on the photoelectric conversion portion 24 in the substrate 2 via the color filter layer 19.

The wiring layer 22 is formed on the front surface S2 side of the substrate 2, and includes wirings 37 stacked as a plurality of layers (three layers in FIG. 2) via an interlayer insulation film 36. The pixel transistors constituting each pixel 9 are driven via the plurality of layers of wirings 37 formed in the wiring layer 22. The support substrate 23 is formed on a surface of the wiring layer 22 opposite to the side facing the substrate 2. The support substrate 23 is a substrate for ensuring the strength of the substrate 2 in processing of manufacturing the solid-state imaging device 1. As a material of the support substrate 23, for example, silicon (Si) can be adopted.

In the solid-state imaging device 1 having the above configuration, light is radiated from the back surface side of the substrate 2 (the back surface S1 side of the light reception layer 18), the irradiated light is transmitted through the on-chip lens 20 and the color filter layer 19, and the transmitted light is photoelectrically converted by the photoelectric conversion portion 24 such that signal charge is generated. The generated signal charge is output as a pixel signal on the vertical signal line 11 illustrated in FIG. 1 formed of the wiring 37 via the pixel transistor formed on the front surface S2 side of the substrate 2.

[1-3 Method of Manufacturing Solid-State Imaging Device]

Next, a method of manufacturing the solid-state imaging device 1 of the first embodiment will be described. FIGS. 5A, 5B, 5C, 5D, and 5E are cross-sectional views illustrating processing of manufacturing the solid-state imaging device 1 of the first embodiment.

Figure 5A:
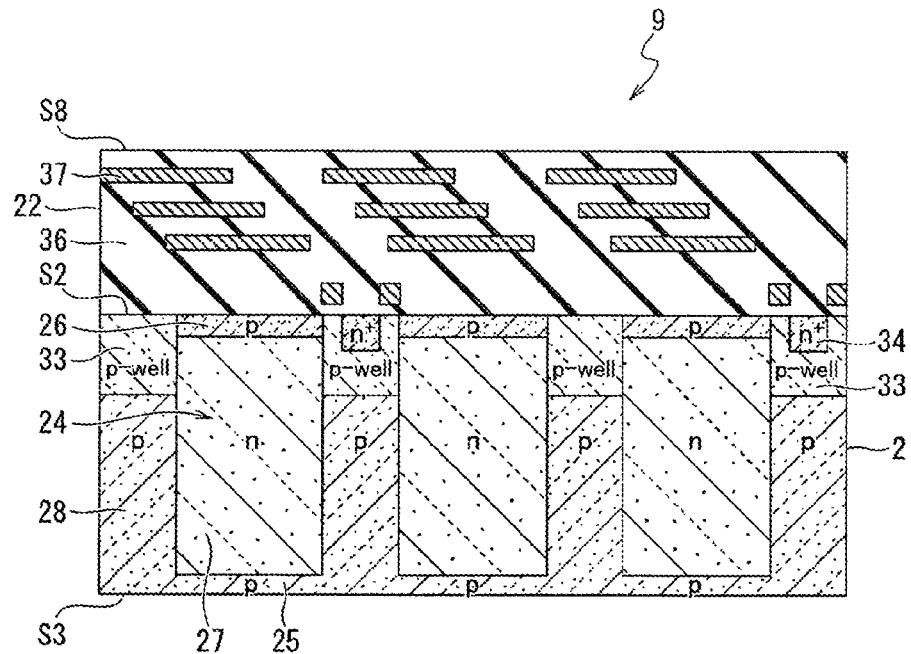
FIG. 5A is a diagram illustrating a flow of processing of manufacturing the solid-state imaging device according to the first embodiment.

First, as illustrated in FIG. 5A, the photoelectric conversion portion 24, the pixel transistor, and the pixel isolation layer 28 are formed on the substrate 2, and then the interlayer insulation film 36 and the wiring 37 are alternately formed on the front surface S2 of the substrate 2 so that the wiring layer 22 is formed. An impurity region such as the photoelectric conversion portion 24 formed on the substrate 2 is formed by implanting ion of a desired impurity into the substrate 2 from the front surface S2 side of the substrate 2.

Figure 5B:
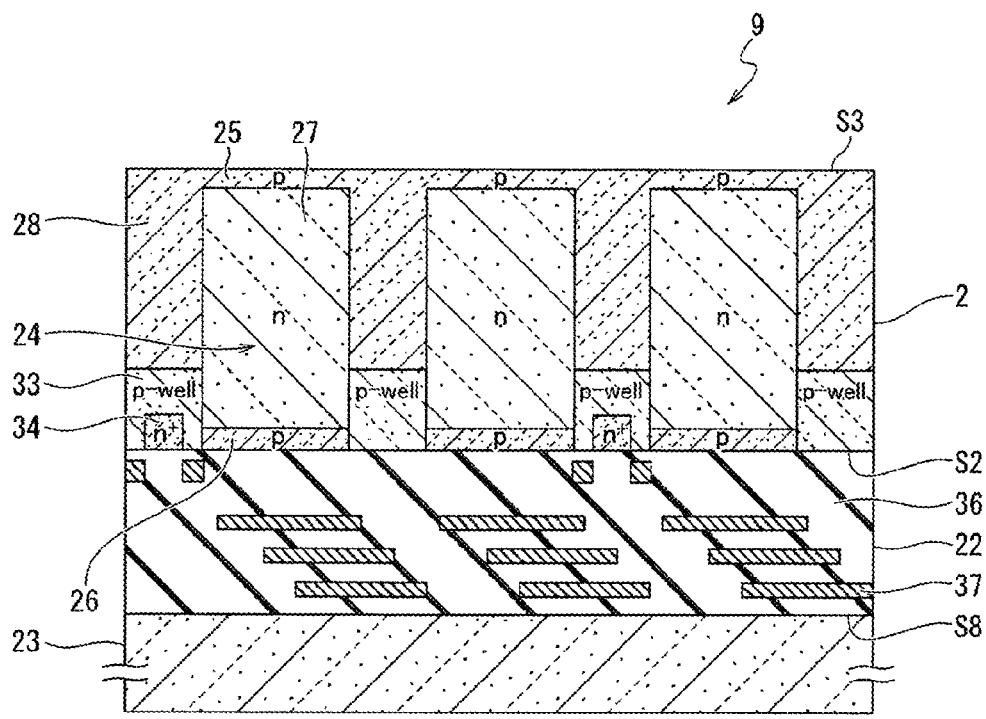
FIG. 5B is a diagram illustrating the flow of processing of manufacturing the solid-state imaging device according to the first embodiment.

Subsequently, the support substrate 23 made of silicon (see FIG. 5B) is adhered to an outermost surface S8 of the wiring layer 22 and then, a stack of the substrate 2, the wiring layer 22 and the support substrate 23 is inverted. Manufacturing processing up to here is the same as for a normal back-illuminated solid-state imaging device. Subsequently, after the substrate 2 is inverted, the substrate 2 is polished from the back surface S3 side to be thinned to a desired thickness, as illustrated in FIG. 5B.

Figure 5C:
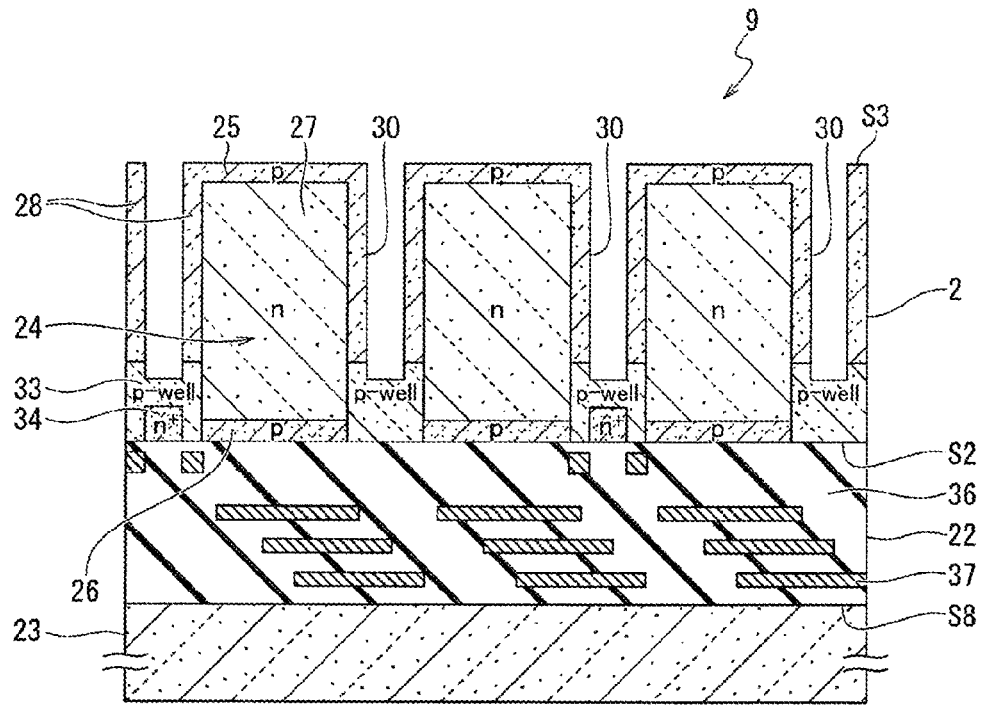
FIG. 5C is a diagram illustrating the flow of processing of manufacturing the solid-state imaging device according to the first embodiment.

Subsequently, at a boundary of each pixel 9 of the substrate 2, that is, at a portion in which the pixel isolation layer 28 is formed as illustrated in FIG. 5C, selective etching is performed in a depth direction from the back surface S3 side of the substrate 2 (a direction from the back surface S3 to the front surface S2) so that the groove portion 30 having a desired depth is formed. As a method of forming the groove portion 30, for example, a method of providing a hard mask (not illustrated) having a desired opening on the back surface S3 of the substrate 2 and performing etching through the provided hard mask can be adopted.

A step of forming the groove portion 30 can be shared with other substrate penetration processes. Thus, when the step is shared with other substrate penetration processes, the number of steps can be reduced.

Figure 5D:
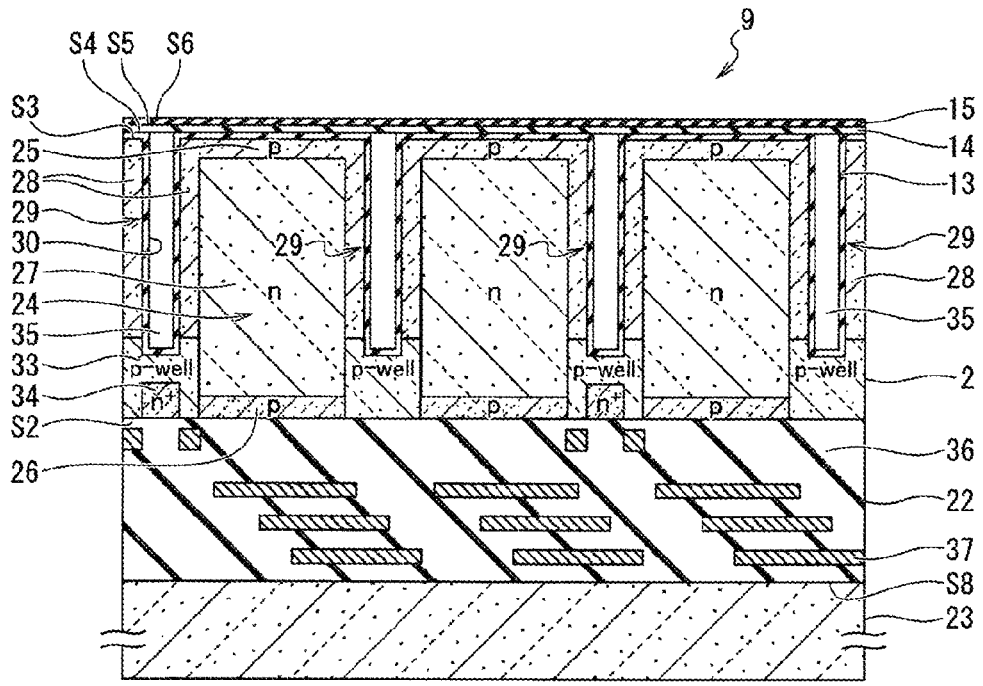
FIG. 5D is a diagram illustrating the flow of processing of manufacturing the solid-state imaging device according to the first embodiment.

Subsequently, the hard mask used for processing of the groove portion 30 is removed, and the first fixed charge film 13 is formed so that the sidewall surface and the bottom surface of the groove portion 30 and the entirety on the back surface S3 side (the entirety on the light reception surface side) of the substrate 2 are continuously covered using the ALD method or the CVD method as illustrated in FIG. 5D. Thereafter, the open end of the groove portion 30 is closed using the PVD method or the CVD method, and the second fixed charge film 14 is formed so that the entirety on the back surface S4 side (the entirety on the light reception surface side) of the first fixed charge film 13 is covered. In the step of forming the second fixed charge film 14, a film forming condition is set so that the open end side of the groove portion 30 is closed before the inside of the groove portion 30 is completely embedded by the second fixed charge film 14. Thus, the film forming conditions is optimized such that the element isolation portion 29 having the void 35 can be formed. Accordingly, the straight portion 31 and the intersection portion 32 of the groove portion 30 illustrated in FIG. 3 are closed by the second fixed charge film 14 with the void 35 left inside the groove portion 30. An internal space of the void 35 is formed in a grid pattern extending along the straight portion 31 and the intersection portion 32 of the groove portion 30.

Figure 5E:
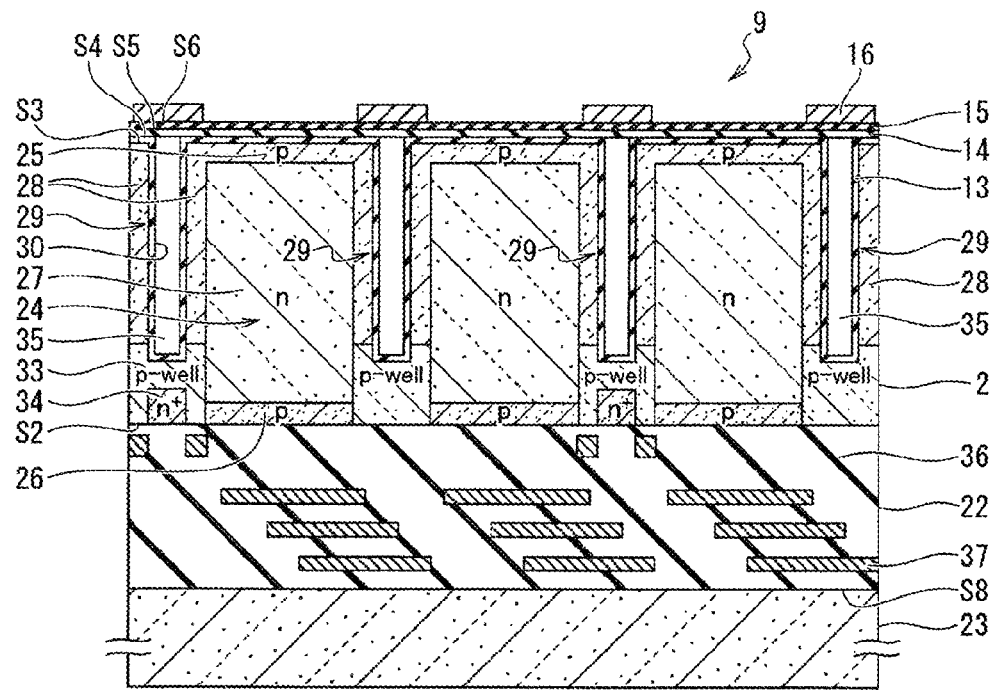
FIG. 5E is a diagram illustrating the flow of processing of manufacturing the solid-state imaging device according to the first embodiment.

Subsequently, the insulation film 15 is formed so that the entirety on the back surface S5 side (the entirety on the light reception surface side) of the second fixed charge film 14 is covered using a PVD method or a CVD method. Subsequently, a light shielding material layer is formed on the entirety on the back surface S6 side of the insulation film 15 and then is patterned in a desired shape. Accordingly, the photoelectric conversion portion 24 is opened so that the light shielding film 16 that shields light between adjacent pixels 9 is formed, as illustrated in FIG. 5E. Thereafter, the color filter layer 19 and the on-chip lens 20 are formed on the front surface S2 side of the substrate 2 such that the solid-state imaging device 1 is completed as illustrated in FIG. 2.

As described above, in the solid-state imaging device 1 of the first embodiment, the groove portion 30 provided between the adjacent photoelectric conversion portions 24 is closed with the void 35 left inside the groove portion 30 by the second fixed charge film 14. Therefore, since a difference between a refractive index of the substrate 2 (for example, 3.9 in the case of silicon (Si)) and a refractive index of the void 35 (for example, 1.0 in the case of being filled with air) is great, sufficient reflection characteristics can be obtained in the groove portion 30 between the adjacent photoelectric conversion portions 24, it is difficult for light to be transmitted through the groove portion 30, and optical color mixing can be curbed. Since a film thickness of the first fixed charge film 13 between the substrate 2 and the void 35 is very small, an influence on the reflection characteristics is small.

Further, the photoelectric conversion portion 24 of each pixel 9 is isolated by the element isolation portion 29 in which the void 35 is formed in the groove portion 30. Therefore, it is possible to curb leakage of the signal charge accumulated in the photoelectric conversion portion 24 to the adjacent photoelectric conversion portion 24 side. Thus, when an amount of signal charge equal to or larger than a saturated charge amount is generated in the photoelectric conversion portion 24, it is possible to efficiently swept out the signal charge to the floating diffusion portion 34 side. This can curb the occurrence of blooming.

Further, in the solid-state imaging device 1 of the first embodiment, the first fixed charge film 13 having negative charge is formed in the groove portion 30. Therefore, generation of an interface level and generation of a dark current caused by the interface level can be curbed due to a negative bias effect of the first fixed charge film 13. Further, an inversion layer (p-type) is formed on a surface that is in contact with the first fixed charge film 13, and positive charge is induced. Therefore, even when the p-well layer 33 or the pixel isolation layer 28 configured of the p-type semiconductor region is formed with a low p-type impurity concentration, an effect of a function of isolating the pixels 9 or curbing a dark current can be sufficiently exhibited.

[1-4 Modification Example]

Figure 6:
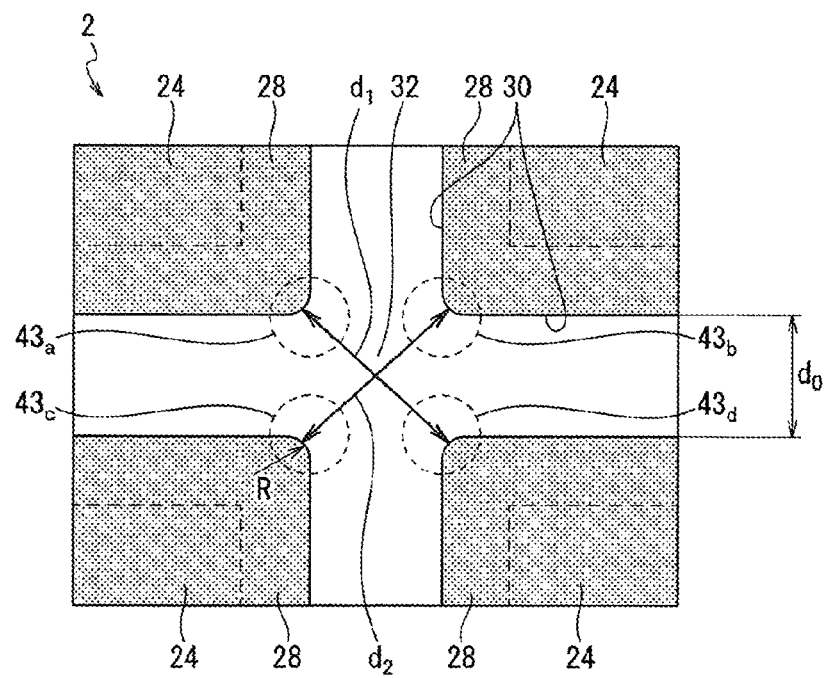
FIG. 6 is a diagram illustrating a planar layout of a substrate of a solid-state imaging device according to a modification example.

(1) An example in which an arrangement, shape, and the like of corner portions 43a, 43b, 43c, and 44d formed on sidewall surfaces of the groove portions 30 intersecting with each other at the intersection portion 32 have been adjusted in the solid-state imaging device 1 according to the modification example of the first embodiment will be described. FIG. 6 is a diagram illustrating a planar layout of the substrate 2 according to the modification example. In FIG. 6, portions corresponding to FIG. 2 are denoted by the same reference signs, and duplicate description will be omitted.

As illustrated in FIG. 6, in the solid-state imaging device 1 according to the modification example, a distance $d_1$ between the corner portion 43a and the corner portion 43c and a distance $d_2$ between the corner portion 43b and the corner portion 44d located at diagonal directions with respect to respective directions in which the groove portions 30 extend among the four corner portions 43a, 43b, 43c, and 44d of the intersection portion 32 are set to be equal to or smaller than predetermined value times a width $d_0$ of the groove portion 30. The predetermined value times, for example, is preferably 2.5 times, more preferably 1.4 times, and most preferably 1.0 times. When such an upper limit value is set, lower limit values of the distances $d_1$ and $d_2$ are preferably larger than 0 times the width $d_0$.

Further, the distances $d_1$ and $d_2$ may be set to a predetermined distance or less in addition to setting the distances $d_1$ and $d_2$ to predetermined value times the width $d_0$, or instead of setting the distances $d_1$ and $d_2$ to predetermined value times the width $d_0$. The predetermined distance is, for example, preferably 250 nm, more preferably 150 nm, and most preferably 50 nm. When such an upper limit value is set, lower limit values of the distances $d_1$ and $d_2$ are preferably larger than 0 nm.

Figure 7:
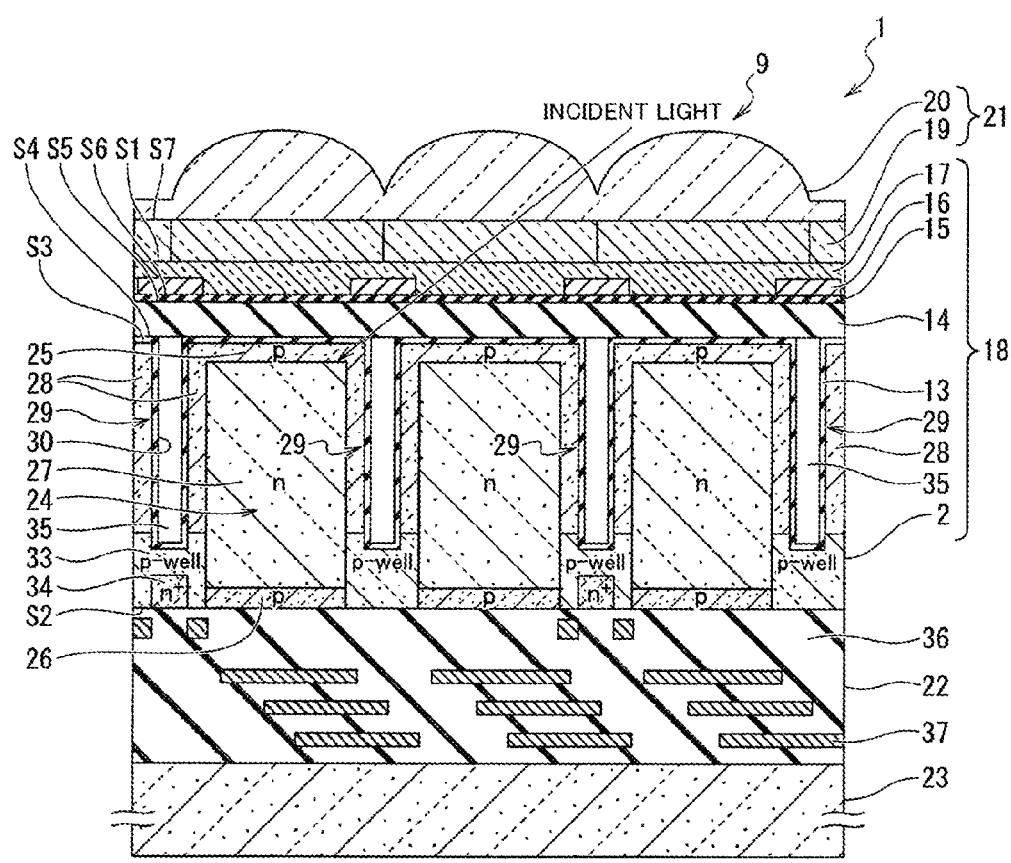
FIG. 7 is a diagram illustrating a cross-sectional configuration of a pixel region of a solid-state imaging device according to the related art.
Figure 8A:
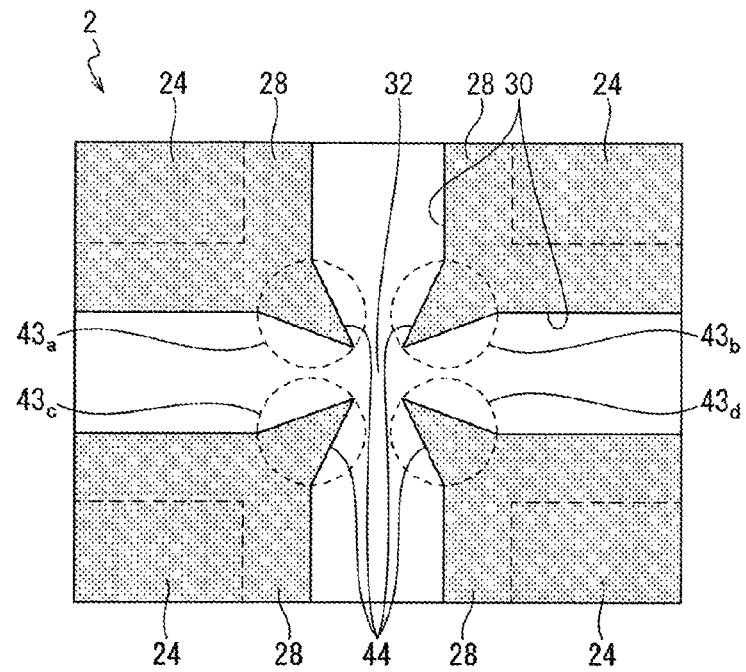
FIG. 8A is a diagram illustrating a configuration of an intersection portion of a solid-state imaging device according to the modification example.
Figure 8B:
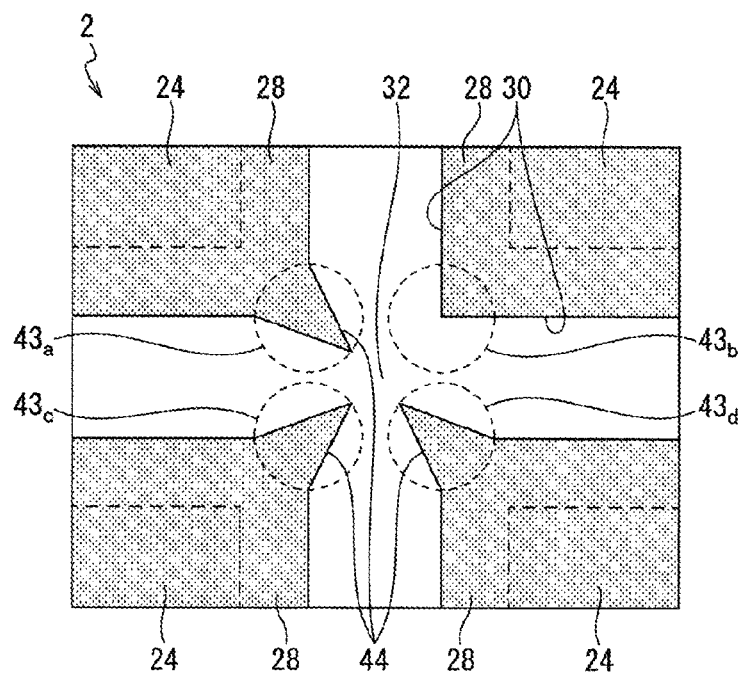
FIG. 8B is a diagram illustrating the configuration of the intersection portion of the solid-state imaging device according to the modification example.
Figure 8C:
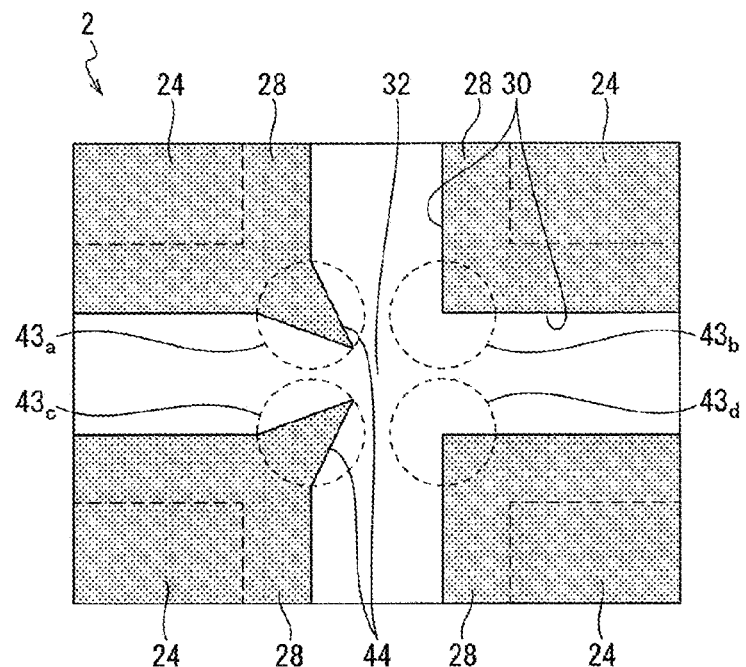
FIG. 8C is a diagram illustrating the configuration of the intersection portion of the solid-state imaging device according to the modification example.
Figure 8D:
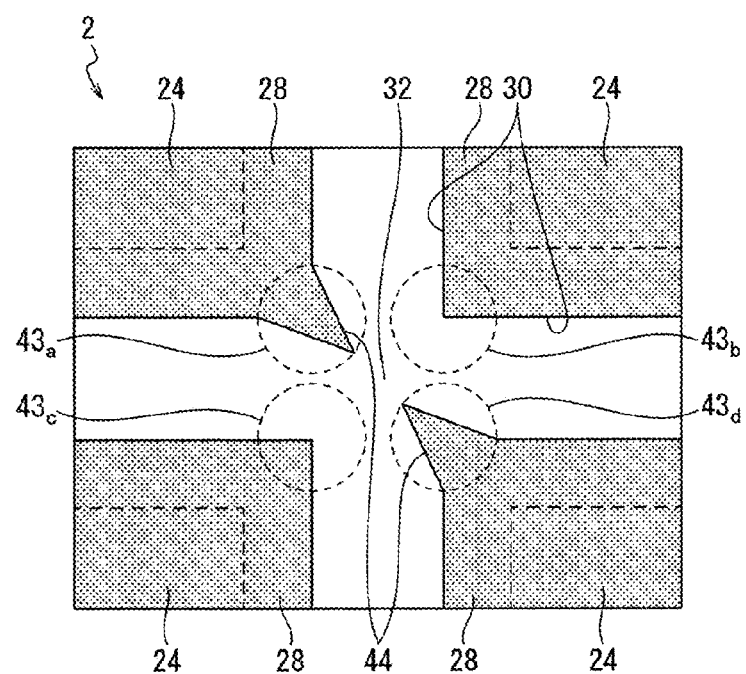
FIG. 8D is a diagram illustrating the configuration of the intersection portion of the solid-state imaging device according to the modification example.
Figure 8E:
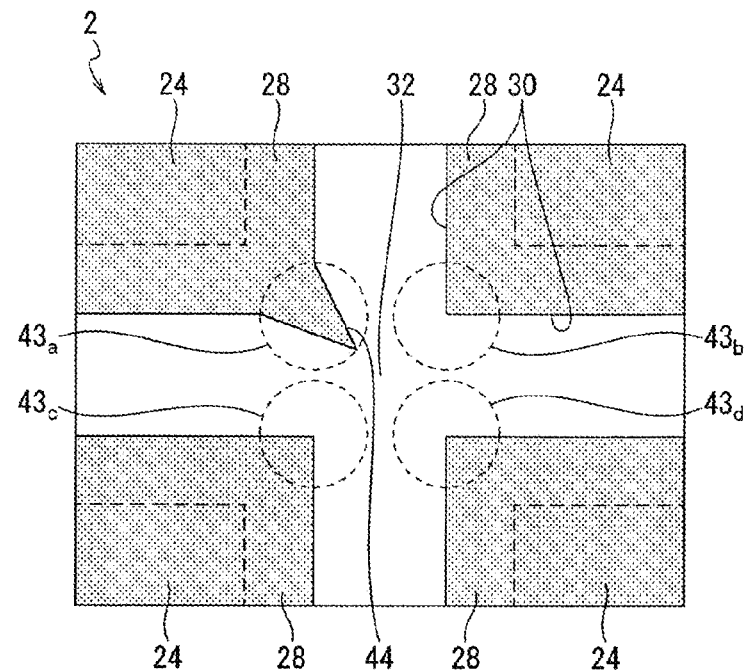
FIG. 8E is a diagram illustrating the configuration of the intersection portion of the solid-state imaging device according to the modification example.
Figure 9A:
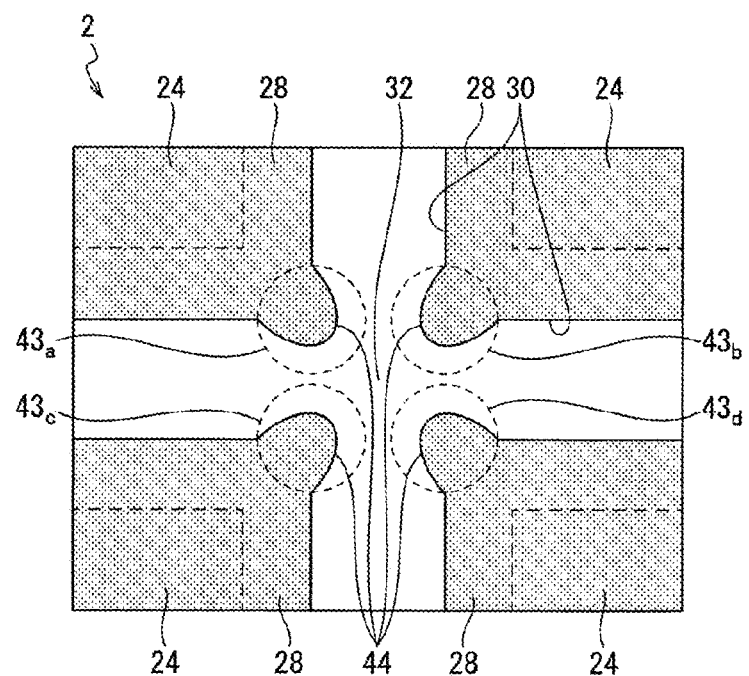
FIG. 9A is a diagram illustrating the configuration of the intersection portion of the solid-state imaging device according to the modification example.
Figure 9B:
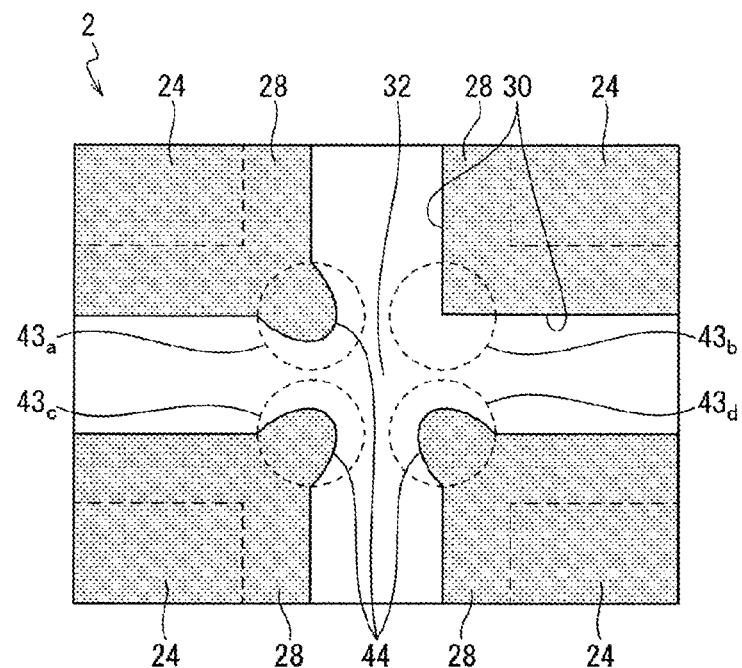
FIG. 9B is a diagram illustrating the configuration of the intersection portion of the solid-state imaging device according to the modification example.
Figure 9C:
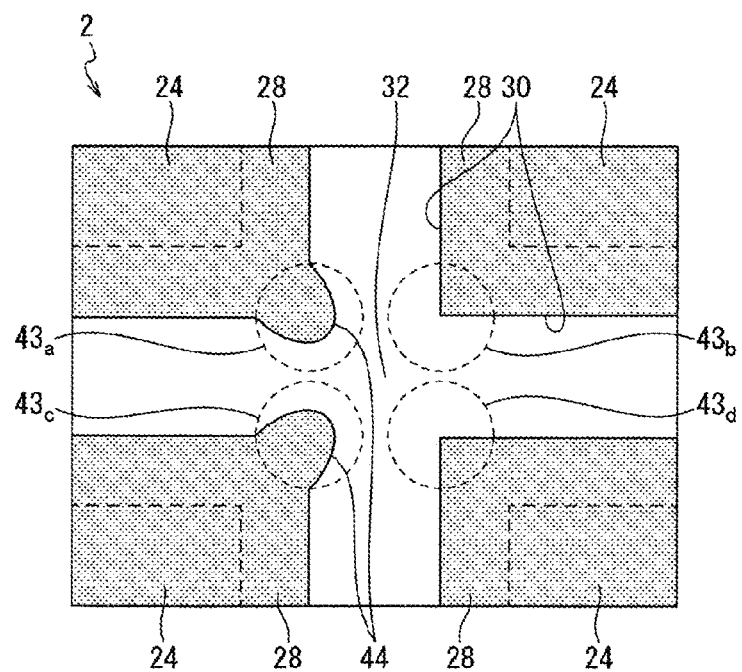
FIG. 9C is a diagram illustrating the configuration of the intersection portion of the solid-state imaging device according to the modification example.
Figure 9D:
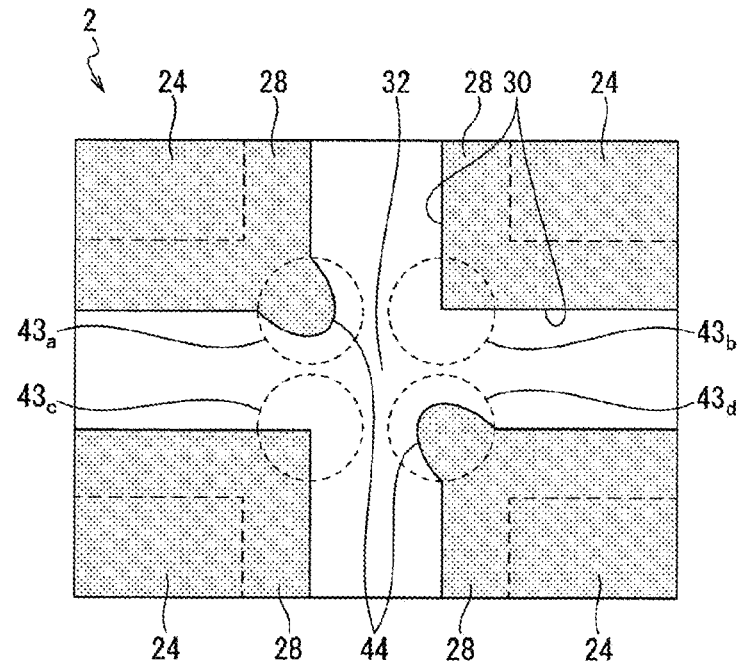
FIG. 9D is a diagram illustrating the configuration of the intersection portion of the solid-state imaging device according to the modification example.
Figure 9E:
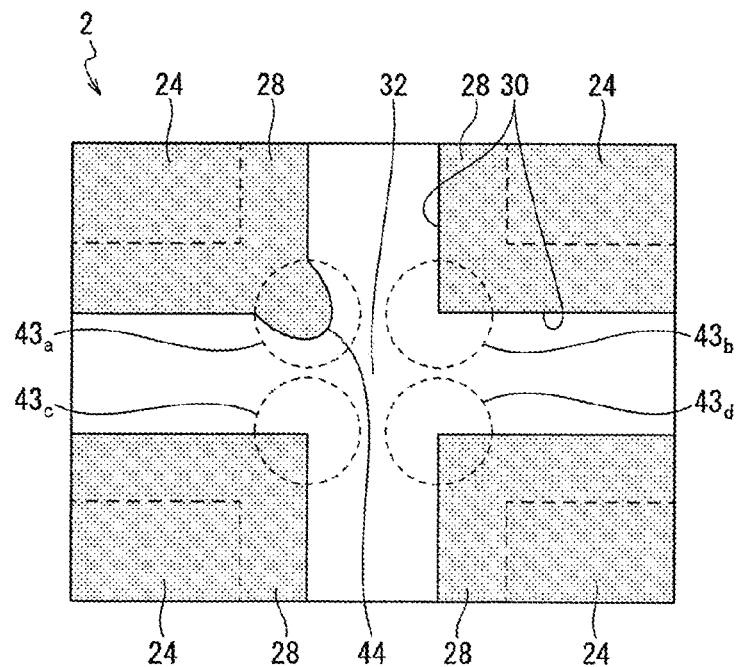
FIG. 9E is a diagram illustrating the configuration of the intersection portion of the solid-state imaging device according to the modification example.
Figure 10A:
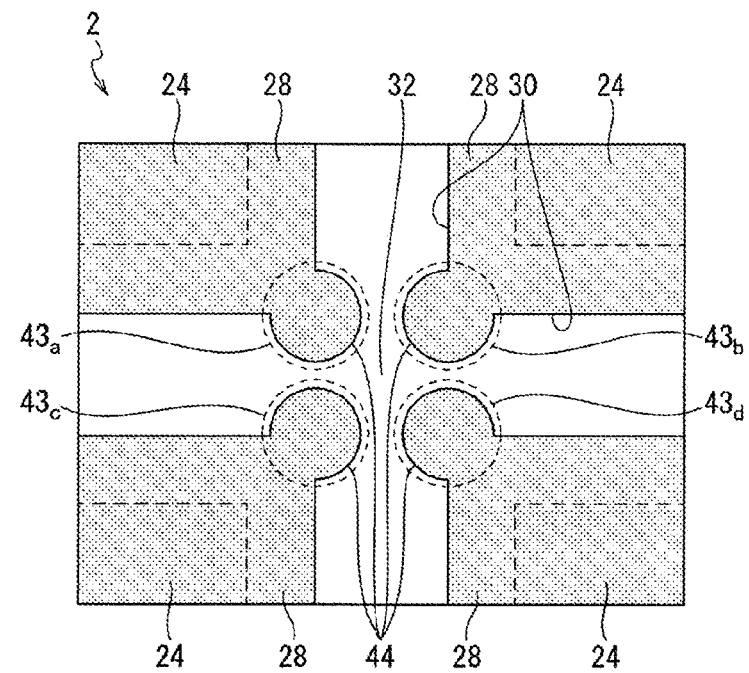
FIG. 10A is a diagram illustrating the configuration of the intersection portion of the solid-state imaging device according to the modification example.
Figure 10B:
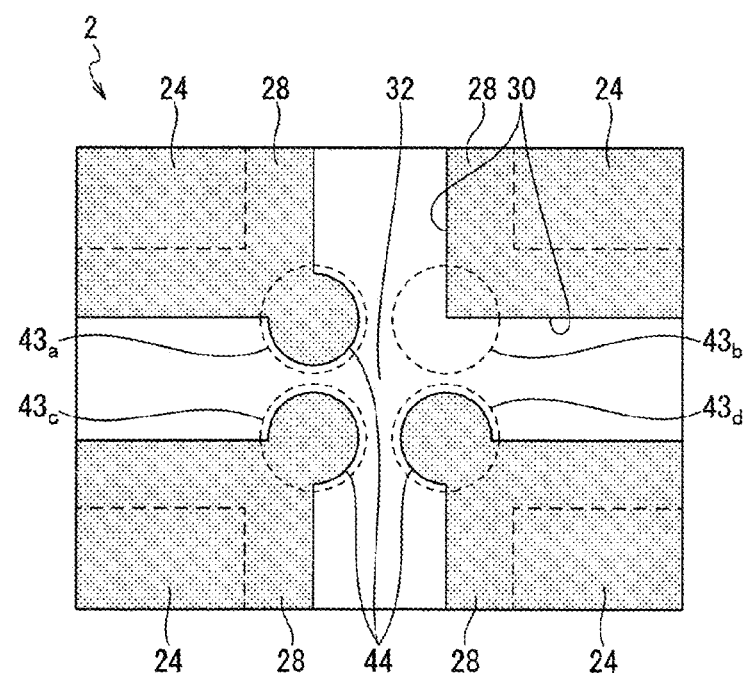
FIG. 10B is a diagram illustrating the configuration of the intersection portion of the solid-state imaging device according to the modification example.
Figure 10C:
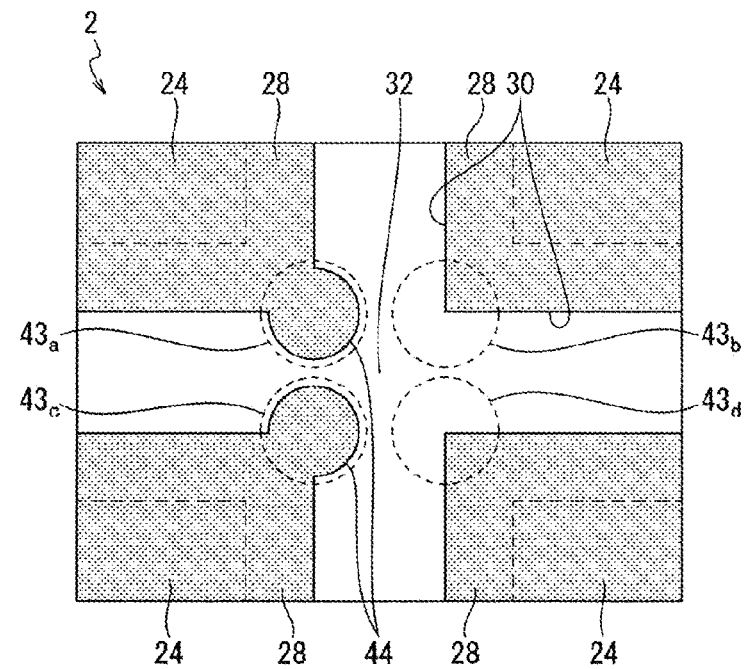
FIG. 10C is a diagram illustrating the configuration of the intersection portion of the solid-state imaging device according to the modification example.
Figure 10D:
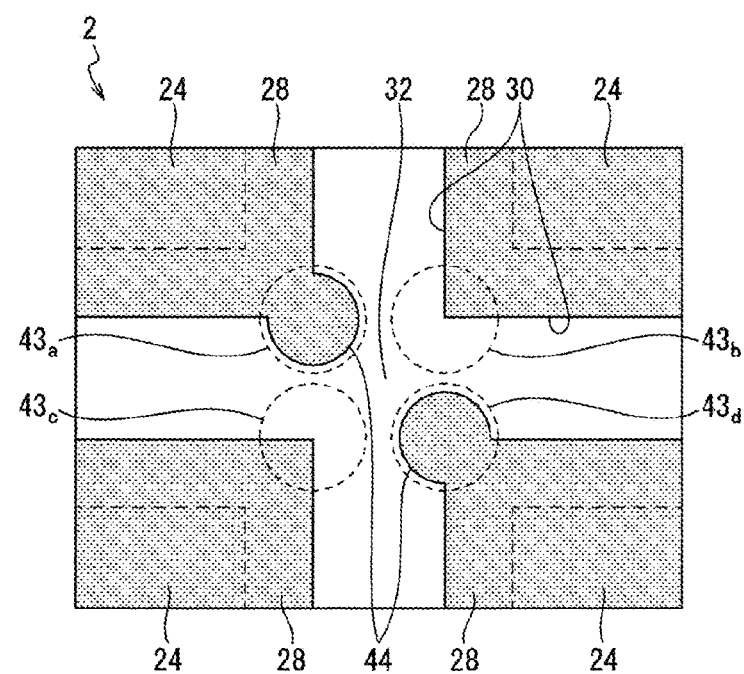
FIG. 10D is a diagram illustrating the configuration of the intersection portion of the solid-state imaging device according to the modification example.
Figure 10E:
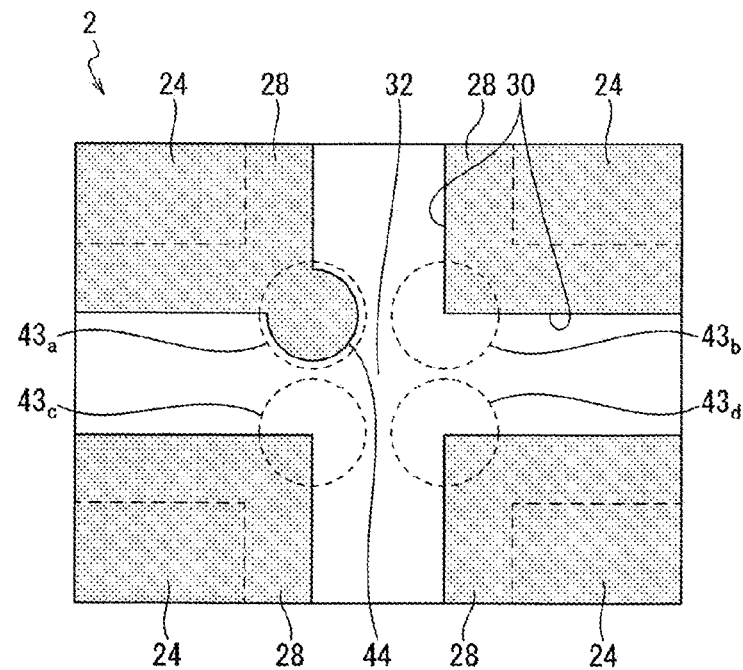
FIG. 10E is a diagram illustrating the configuration of the intersection portion of the solid-state imaging device according to the modification example.
Figure 11A:
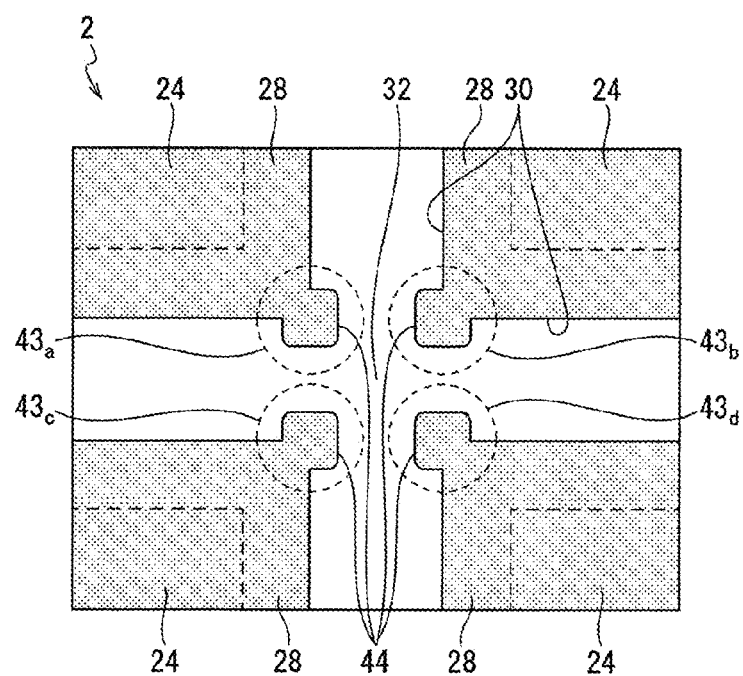
FIG. 11A is a diagram illustrating the configuration of the intersection portion of the solid-state imaging device according to the modification example.
Figure 11B:
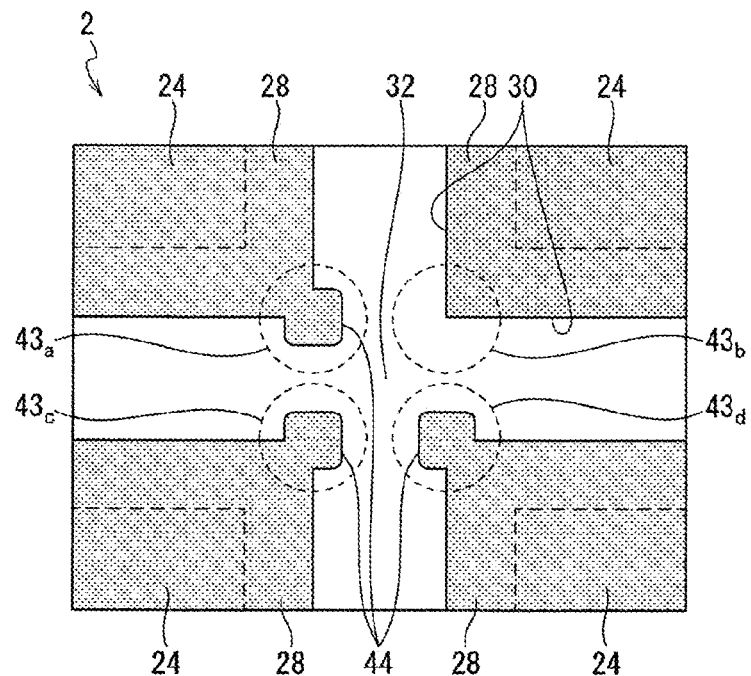
FIG. 11B is a diagram illustrating the configuration of the intersection portion of the solid-state imaging device according to the modification example.
Figure 11C:
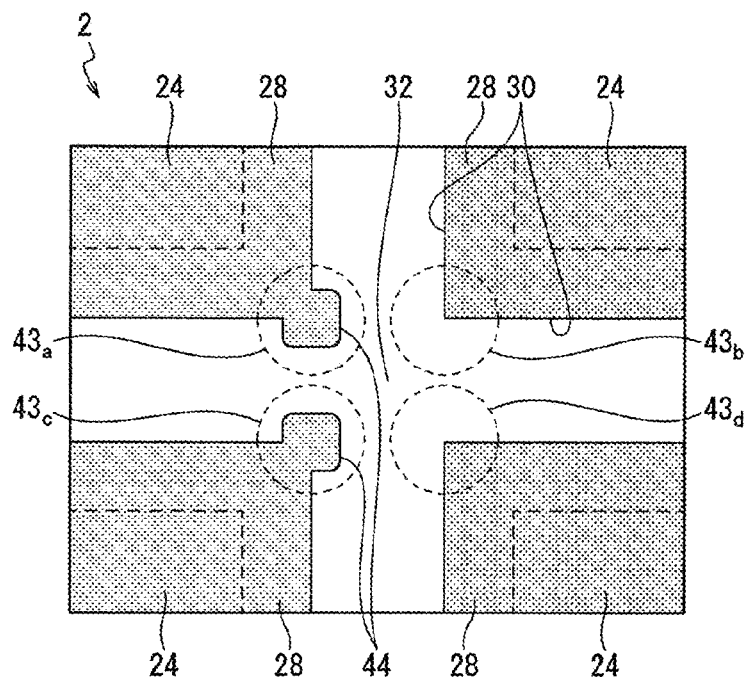
FIG. 11C is a diagram illustrating the configuration of the intersection portion of the solid-state imaging device according to the modification example.
Figure 11D:
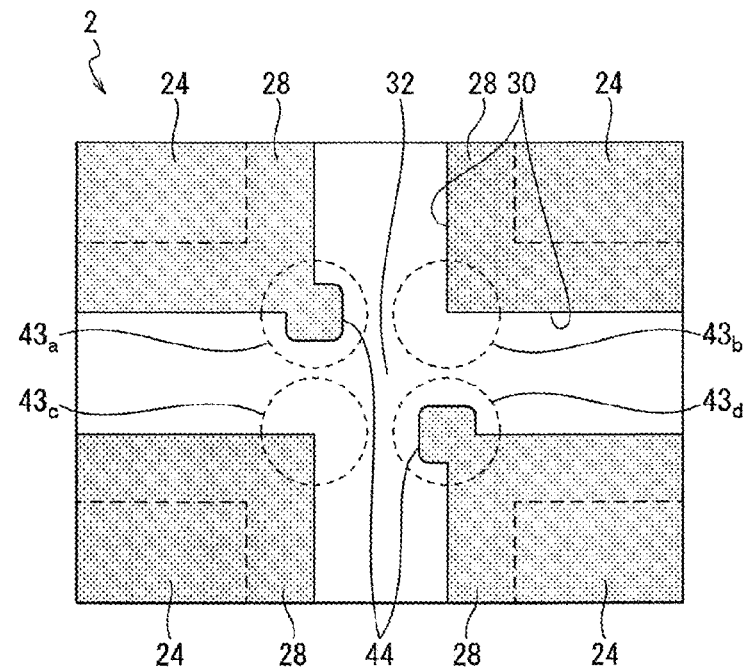
FIG. 11D is a diagram illustrating the configuration of the intersection portion of the solid-state imaging device according to the modification example.
Figure 11E:
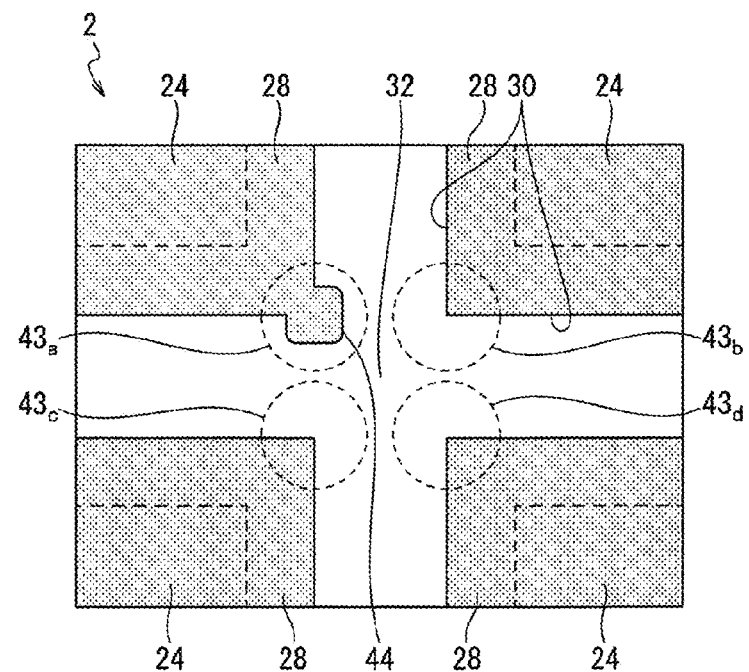
FIG. 11E is a diagram illustrating the configuration of the intersection portion of the solid-state imaging device according to the modification example.

When the distances $d_1$ and $d_2$ are larger than 2.5 times the width $d_0$ or when the distances $d_1$ and $d_2$ are larger than 250 nm, the PVD method or the CVD method must be performed for a long time when the second fixed charge film 14 is formed in order to close the open end of the intersection portion 32 by the second fixed charge film 14 as illustrated in FIG. 2, which is likely to increase a film thickness of the second fixed charge film 14 so that the second fixed charge film 14 gets taller as illustrated in FIG. 7. When the second fixed charge film 14 gets taller, there is a possibility of a distance between the light shielding film 16 and the groove portion 30 increasing, light being transmitted through the first fixed charge film 13 and the second fixed charge film 14, and optical color mixing (upper layer color mixing) occurring. Further, there is a possibility of an opening area of the pixel 9 and a volume of the photoelectric conversion portion 24 being reduced and sensitivity being lowered.

On the other hand, in the solid-state imaging device 1 according to the modification example, at least one of setting the distances $d_1$ and $d_2$ to be equal to or smaller than 2.5 times of the width $d_0$ and setting the distances $d_1$ and $d_2$ to 250 nm or less is performed. Therefore, the second fixed charge film 14 can be lower and optical color mixing can be curbed. Further, it is possible to increase the opening area of the pixel 9 and the volume of the photoelectric conversion portion 24, and to improve the sensitivity.

On the other hand, when the distances $d_1$ and $d_2$ are 0 nm, the corner portions 43a, 43b, 43c, and 44d come into contact with each other. On the other hand, in the solid-state imaging device 1 according to the modification example, the distances $d_1$ and $d_2$ are made larger than 0 nm. Therefore, the corner portions 43a, 43b, 43c, and 44d do not come into contact with each other.

Further, in the solid-state imaging device 1 according to the modification example, at least one of the four corner portions 43a, 43b, 43c, and 44d of the intersection portion 32 may be rounded in an arc shape when viewed from the incidence side of the light, and a radius of curvature R of the arc may be set to a predetermined value or less. As the predetermined value, for example, 20 nm is preferable, 10 nm or less is more preferable, and 5 nm or less is most preferable. As a method of measuring the radius of curvature R, for example, it is possible to use a method of fitting approximate curves of arcs having various radii to measured values of the shapes of the corner portions 43a, 43b, 43c, and 44d using the least squares method. When such an upper limit value is set, a lower limit value of the radius of curvature R is, for example, preferably 1 nm or more, more preferably 2 nm or more, and most preferably 3 nm or more.

When the radius of curvature R is larger than 20 nm, setting the distances $d_1$ and $d_2$ to be equal to or smaller than 2.5 times the width $d_0$ or setting the distances $d_1$ and $d_2$ to 250 nm or less is likely to be difficult. Further, there is a possibility of the opening area of the pixel 9 and the volume of the photoelectric conversion portion 24 being reduced and the sensitivity being lowered. On the other hand, in the solid-state imaging device 1 according to the modification example, the radius of curvature R of the corner portions 43a, 43b, 43c, and 44d is set to 20 nm or less. Therefore, it is possible to reduce the difficulty of setting the distances $d_1$ and $d_2$ to be equal to or smaller than 2.5 times the width $d_0$ or setting the distances $d_1$ and $d_2$ to 250 nm or less. Further, it is possible to increase the opening area of the pixel 9 and the volume of the photoelectric conversion portion 24, and to improve the sensitivity of the solid-state imaging device 1.

On the other hand, when the radius of curvature R is smaller than 1 nm, it becomes difficult to form the corner portions 43a, 43b, 43c, and 44d, the number of steps of forming the intersection portion 32 increases and thus, a manufacturing cost is likely to increase. On the other hand, in the solid-state imaging device 1 according to the modification example, the radius of curvature R is set to 1 nm or more. Therefore, since the difficulty of formation of the corner portions 43a, 43b, 43c, and 44d can be reduced, and the number of steps of forming the intersection portion 32 can be reduced, an increase in manufacturing cost can be curbed.

Further, in the solid-state imaging device 1 according to the modification example, a convex portion 44 protruding to the inner side of the intersection portion 32 may be formed in at least one of the four corner portions 43a, 43b, 43c, and 44d of the intersection portion 32, as illustrated in FIGS. 8A, 8B, 8C, 8D, 8E, 9A, 9B, 9C, 9D, 9E, 10A, 10B, 10C, 10D, 10E, 11A, 11B, 11C, 11D, 11E, 12, and 13. As a shape of the convex portion 44, for example, at least one of an elliptical shape, a perfect circular shape, and a polygonal shape in a plan view can be adopted. FIGS. 8A to 8E illustrate an example in which the convex portion 44 has an isosceles triangle shape with protruding vertices. Further, FIGS. 9A to 9E illustrate an example in which the convex portion 44 has an elliptical shape in which one end of a long axis protrudes. Further, FIGS. 10A to 10E illustrate an example in which the convex portion 44 has a perfect circular shape. Further, FIGS. 11A to 11E illustrate an example in which the convex portion 44 has a quadrangular shape in which one of corner portions protrudes. Further, FIGS. 8A, 9A, 10A, and 11A illustrate an example in which convex portions 44 are provided on all of the four corner portions 43a, 43b, 43c, and 44d.

Further, FIGS. 8B, 9B, 10B, and 11B illustrate an example in which the convex portions 44 are provided only on the three corner portions 43a, 43c, and 44d.

Figure 12:
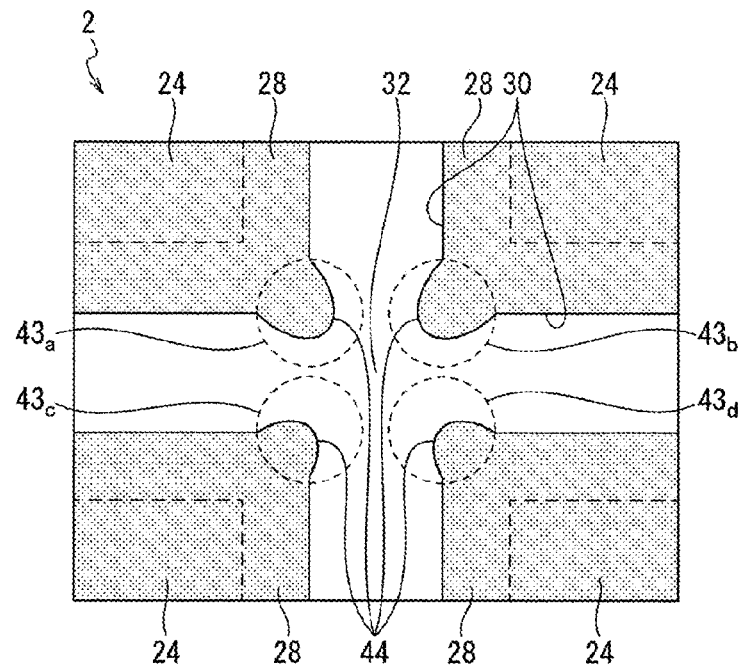
FIG. 12 is a diagram illustrating the configuration of the intersection portion of the solid-state imaging device according to the modification example.
Figure 13:
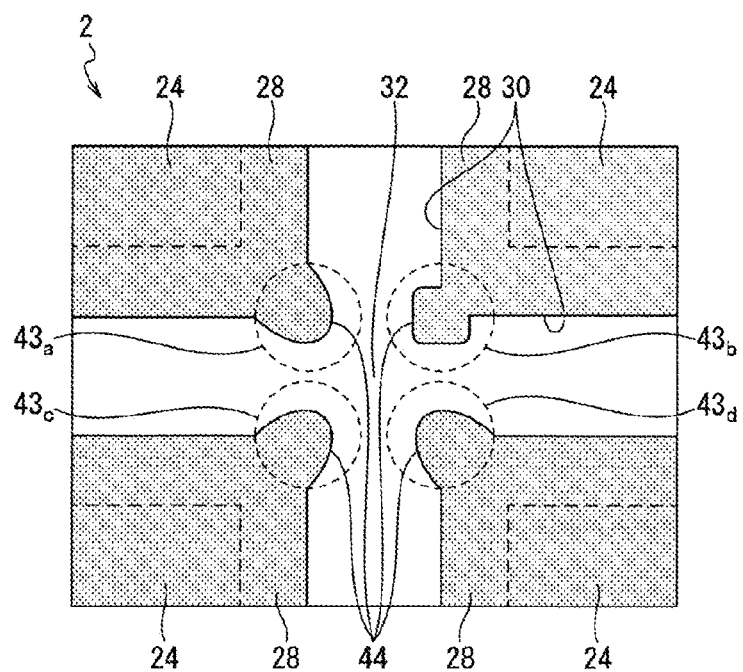
FIG. 13 is a diagram illustrating the configuration of the intersection portion of the solid-state imaging device according to the modification example.
Figure 14A:
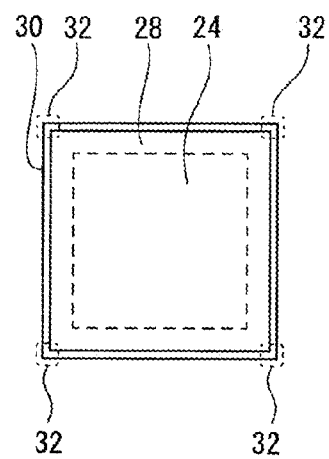
FIG. 14A is a diagram illustrating a pixel structure of the solid-state imaging device according to the modification example.
Figure 14B:
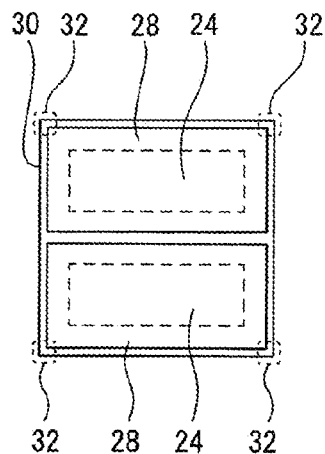
FIG. 14B is a diagram illustrating the pixel structure of the solid-state imaging device according to the modification example.
Figure 14C:
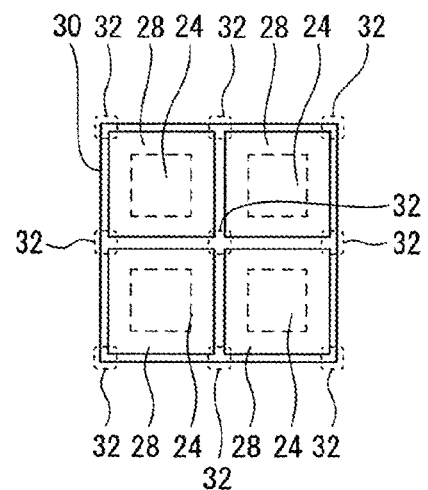
FIG. 14C is a diagram illustrating the pixel structure of the solid-state imaging device according to the modification example.
Figure 14D:
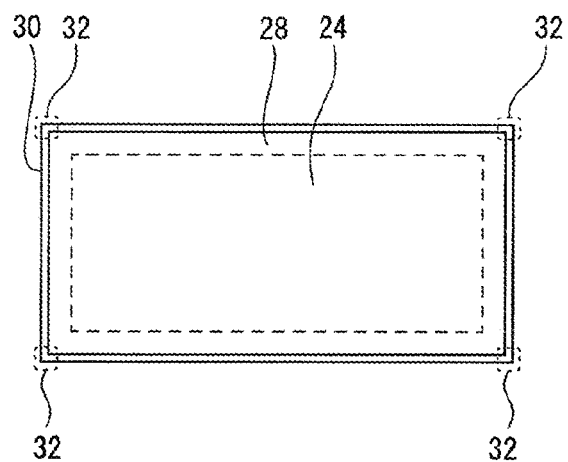
FIG. 14D is a diagram illustrating the pixel structure of the solid-state imaging device according to the modification example.

Further, FIGS. 8C, 8D, 9C, 9D, 10C, 10D, 11C, and 11D illustrate an example in which the convex portion 44 is provided only in two corner portions 43a and 43c or two corner portions 43a and 43d among the four corner portions 43a, 43b, 43c, and 44d. Further, FIGS. 8E, 9E, 10E, and 11E illustrate an example in which the convex portion 44 is provided only on one corner portion 43a. Further, FIGS. 12 and 13 illustrate an example in which the arrangement of the convex portions 44 of the four corner portions 43a, 43b, 43c, and 43d is asymmetric.

Here, when the convex portions 44 are not provided at the corner portions 43a, 43b, 43c, and 44d of the intersection portion 32, the distances $d_1$ and $d_2$ cannot be 1.4 times or less the width $d_0$. On the other hand, in the solid-state imaging device 1 according to the modification example, since the convex portions 44 are formed at the corner portions 43a, 43b, 43c, and 44d, the distances $d_1$ and $d_2$ can be shortened, and the distances $d_1$ and $d_2$ can be 1.4 times or less the width $d_0$. The solid-state imaging device 1 according to the modification example can be used for the pixel 9 having a square pixel structure, a double pixel structure, a quadruple pixel structure, and a rectangular pixel structure, as illustrated in FIGS. 14A, 14B, 14C, and 14D, for example. When the solid-state imaging device 1 is used for the pixel 9 having the quadruple pixel structure, the solid-state imaging device 1 can also be used for the intersection portion 32 at a center of the quadruple pixel structure.

Figure 15A:
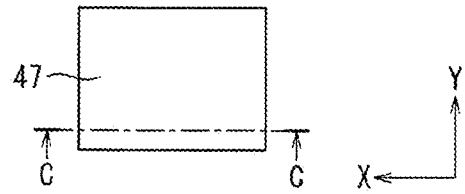
FIG. 15A is a diagram illustrating a flow of processing of manufacturing a solid-state imaging device according to a modification example.
Figure 15B:
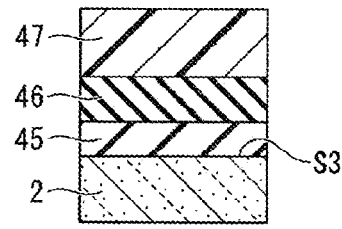
FIG. 15B is a diagram illustrating a cross-sectional configuration taken along line C-C of FIG. 15A.
Figure 15C:
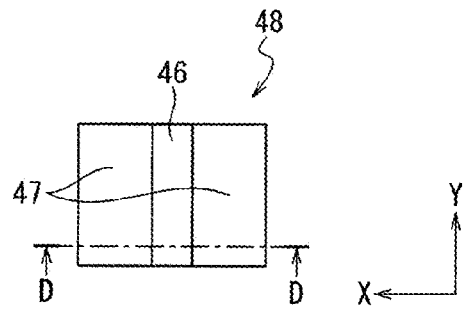
FIG. 15C is a diagram illustrating a flow of processing of manufacturing a solid-state imaging device according to a modification example.
Figure 15D:
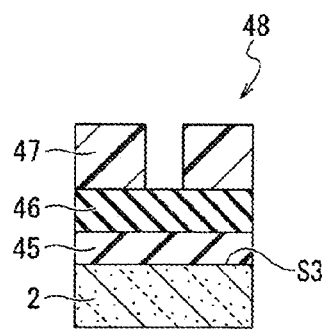
FIG. 15D is a diagram illustrating a cross-sectional configuration taken along line D-D of FIG. 15C.
Figure 15E:
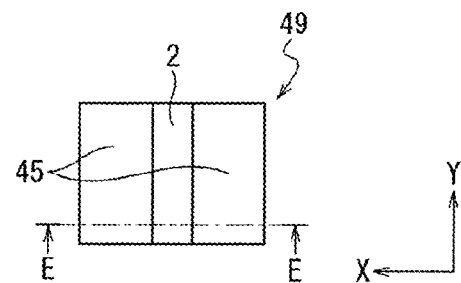
FIG. 15E is a diagram illustrating a flow of processing of manufacturing the solid-state imaging device according to the modification example.
Figure 15F:
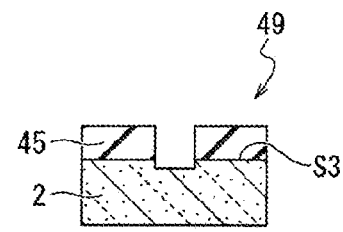
FIG. 15F is a diagram illustrating a cross-sectional configuration taken along line E-E of FIG. 15E.

Next, a procedure for forming the corner portions 43a, 43b, 43c, and 43d having no convex portion 44 at the intersection portion 32 at the time of manufacturing the solid-state imaging device 1 according to the modification example will be described. After a stack of the substrate 2, the wiring layer 22 and the support substrate 23 is formed as illustrated in FIG. 5B, a TEOS layer 45, a BARC layer 46, and a photoresist layer 47 are stacked in this order on the back surface S3 side of the substrate 2 as illustrated in FIGS. 15A and 15B. Subsequently, exposure and development are performed on the photoresist layer 47 through a mask having an opening at a portion corresponding to the groove portion 30 extending in the Y direction in extending directions of the groove portions 30 go straight to each other (hereinafter also referred to as an "X direction" and a "Y direction"). Accordingly, a resist pattern 48 having an opening corresponding to the groove portion 30 extending in the Y direction is formed with respect to the photoresist layer 47, as illustrated in FIGS. 15C and 15D. Subsequently, the BARC layer 46 and the TEOS layer 45 are etched via the resist pattern 48, and then the photoresist layer 47 and the BARC layer 46 are removed so that the hard mask 49 having an opening at the portion corresponding to the groove portion 30 extending in the Y direction is formed, as illustrated in FIGS. 15E and 15F.

Figure 15G:
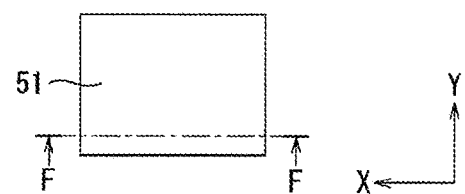
FIG. 15G is a diagram illustrating a flow of processing of manufacturing a solid-state imaging device according to a modification example.
Figure 15H:
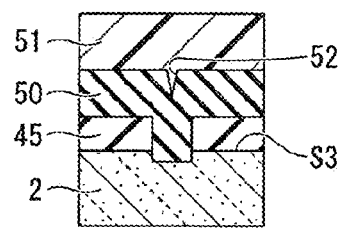
FIG. 15H is a diagram illustrating a cross-sectional configuration taken along line F-F of FIG. 15G.
Figure 15I:
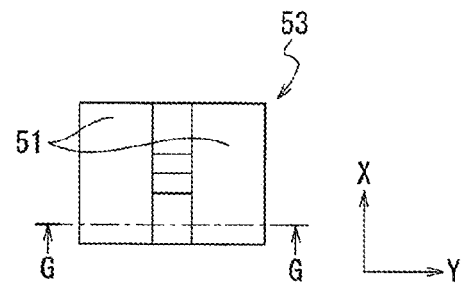
FIG. 15I is a diagram illustrating a flow of processing of manufacturing a solid-state imaging device according to a modification example.
Figure 15J:
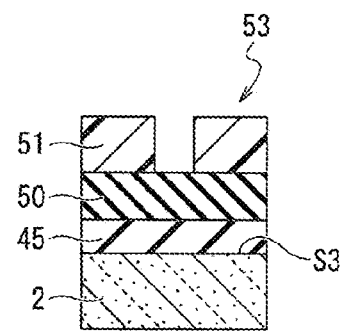
FIG. 15J is a diagram illustrating a cross-sectional configuration taken along line G-G of FIG. 15I.
Figure 15K:
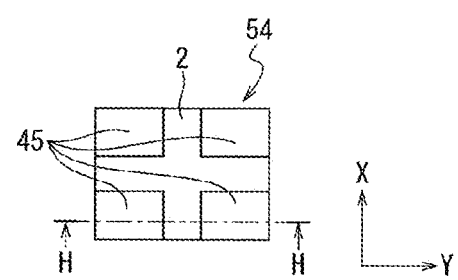
FIG. 15K is a diagram illustrating a flow of processing of manufacturing a solid-state imaging device according to a modification example.
Figure 15L:
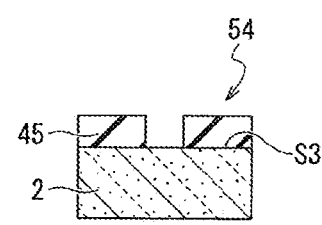
FIG. 15L is a diagram illustrating a cross-sectional configuration taken along line H-H of FIG. 15K.

Subsequently, the BARC layer 50 and the photoresist layer 51 are stacked in this order on the hard mask 49, as illustrated in FIGS. 15G and 15H. In this case, a V-shaped groove portion 52 is formed in the BARC layer 50. Subsequently, exposure and development are performed on the photoresist layer 51 through the mask having the opening at the portion corresponding to the groove portion 30 extending in the X direction. Accordingly, a resist pattern 53 having openings corresponding to the groove portion 30 extending in the X direction is formed with respect to the photoresist layer 51, as illustrated in FIGS. 15I and 15J. Subsequently, etching is performed on the BARC layer 50 and the TEOS layer 45 via the resist pattern 53 and then, the photoresist layer 51 and the BARC layer 50 are removed, so that the hard mask 54 having openings is formed at the portion corresponding to the groove portion 30 extending in the X direction, in addition to the portion corresponding to the groove portion 30 extending in the Y direction, as illustrated in FIGS. 15K and 15L. That is, as the hard mask 54, a mask having openings is formed at portions corresponding to all the groove portions 30 extending in both the X and Y directions go straight to each other.

Figure 15M:
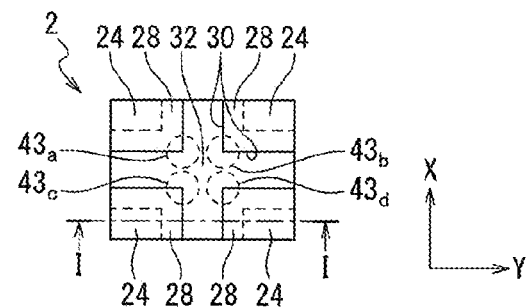
FIG. 15M is a diagram illustrating a flow of processing of manufacturing a solid-state imaging device according to a modification example.
Figure 15N:
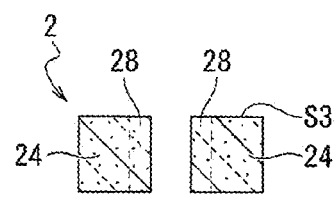
FIG. 15N is a diagram illustrating a cross-sectional configuration taken along line I-I of FIG. 15M.

Subsequently, the substrate 2 is etched through the formed hard mask 54 so that the groove portion 30 extending in both the X direction and the Y direction is formed on the substrate 2, as illustrated in FIGS. 15M and 15N. Accordingly, the intersection portion 32 in which the corner portions 43a, 43b, 43c, and 43d are not rounded is formed.

Figure 16A:
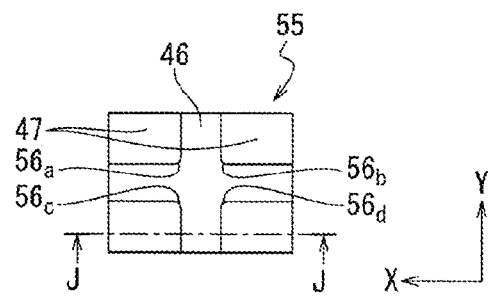
FIG. 16A is a diagram illustrating a flow of processing of manufacturing a solid-state imaging device according to the related art.
Figure 16B:
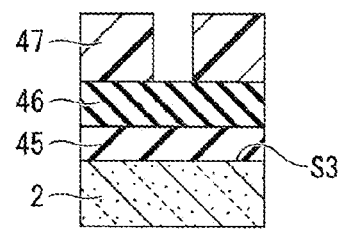
FIG. 16B is a diagram illustrating a cross-sectional configuration taken along line J-J of FIG. 16A
Figure 16C:
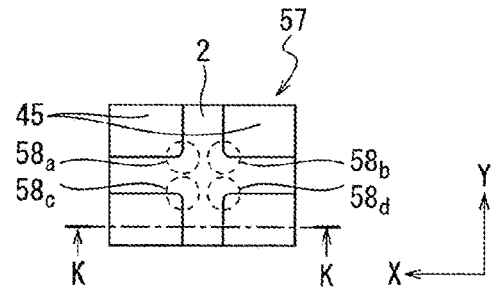
FIG. 16C is a diagram illustrating a flow of processing of manufacturing a solid-state imaging device according to the related art.
Figure 16D:
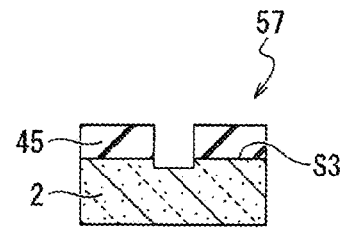
FIG. 16D is a diagram illustrating a cross-sectional configuration taken along line K-K of FIG. 16C.
Figure 16E:
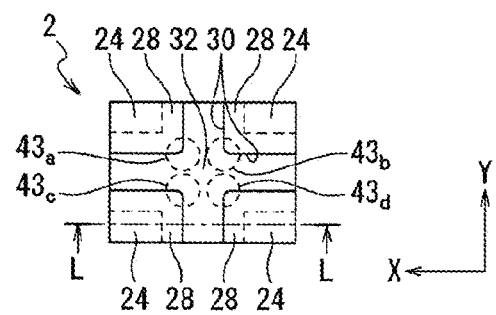
FIG. 16E is a diagram illustrating a flow of processing of manufacturing a solid-state imaging device according to the related art.
Figure 16F:
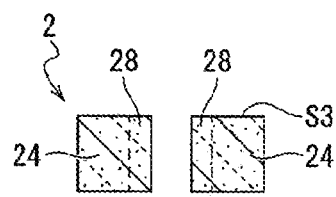
FIG. 16F is a diagram illustrating a cross-sectional configuration taken along line L-L of FIG. 16E.

Incidentally, in the method of forming the hard mask 57 with only one resist pattern 55, the corner portions 56a, 56b, 56c, and 56d of the resist pattern 55 corresponding to the corner portions 43a, 43b, 43c and 43d of the intersection portion 32 are rounded, as illustrated in FIGS. 16A and 16B. Therefore, when the corner portions 56a, 56b, 56c, and 56d are rounded, the corner portions 58a, 58b, 58c, and 58d of the hard mask 57 are also rounded as illustrated in FIGS. 16C and 16D, and the corner portions 43a, 43b, 43c, and 43d of the intersection portion 32 are also rounded as illustrated in FIGS. 16E and 16F.

Figure 17A:
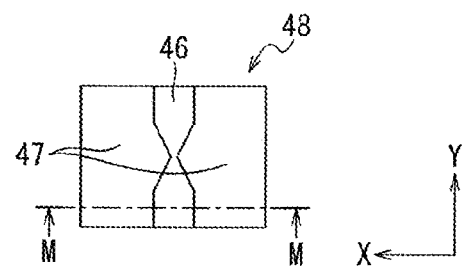
FIG. 17A is a diagram illustrating a flow of processing of manufacturing a solid-state imaging device according to a modification example.
Figure 17B:
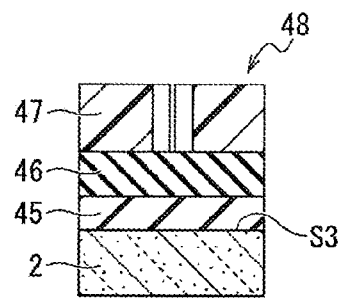
FIG. 17B is a diagram illustrating a cross-sectional configuration taken along line M-M of FIG. 17A.
Figure 17C:
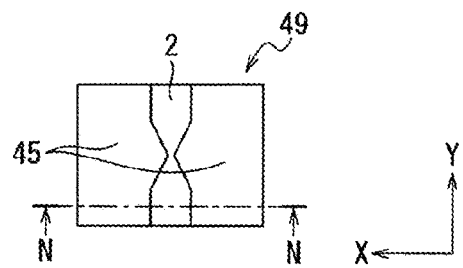
FIG. 17C is a diagram illustrating a flow of processing of manufacturing a solid-state imaging device according to a modification example.
Figure 17D:
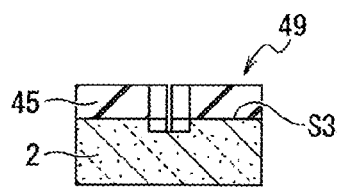
FIG. 17D is a diagram illustrating a cross-sectional configuration taken along line N-N of FIG. 17C.

Next, a procedure for forming the corner portions 43a, 43b, 43c, and 43d having the convex portions 44 at the intersection portion 32 at the time of manufacturing the solid-state imaging device 1 according to the modification example will be described. The TEOS layer 45, the BARC layer 46, and the photoresist layer 47 are stacked in this order on the back surface S3 side of the substrate 2, and then exposure and development are performed on the photoresist layer 47 through the mask having the opening at the portion corresponding to the groove portion 30 extending in the Y direction, as illustrated in FIG. 15A. A mask having openings having a narrowed width at a portion corresponding to a central position of the intersection portion 32 is used as the mask. Accordingly, the resist pattern 48 that is provided at the portion corresponding to the groove portion 30 extending in the Y direction and has an opening having a narrowed width at the portion corresponding to the central position of the intersection portion 32 is formed with respect to the photoresist layer 47, as illustrated in FIGS. 17A and 17B. Subsequently, the BARC layer 46 and the TEOS layer 45 are etched via the resist pattern 48 and then, the photoresist layer 47 and the BARC layer 46 are removed so that the hard mask 49 in which an opening is provided at the portion corresponding to the groove portion 30 extending in the Y direction and a width at the portion corresponding to the central position of the intersection portion 32 in the opening is narrow is formed as illustrated in FIGS. 17C and 17D.

Figure 17E:
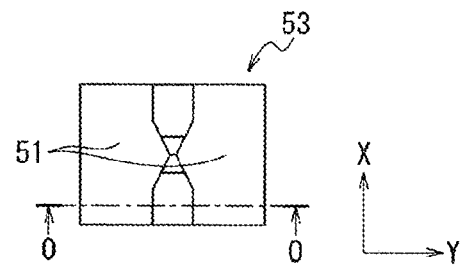
FIG. 17E is a diagram illustrating a flow of processing of manufacturing a solid-state imaging device according to a modification example.
Figure 17F:
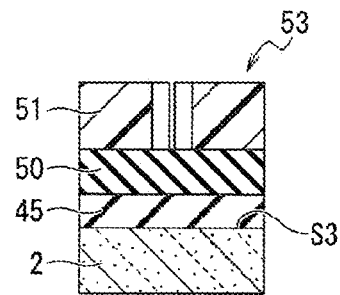
FIG. 17F is a diagram illustrating a cross-sectional configuration taken along line O-O of FIG. 17E.
Figure 17G:
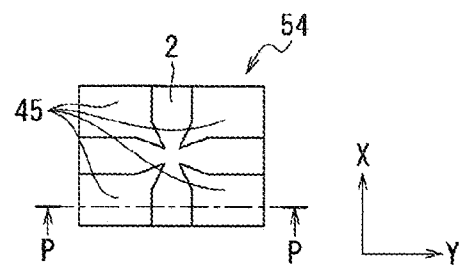
FIG. 17G is a diagram illustrating a flow of processing of manufacturing a solid-state imaging device according to a modification example.
Figure 17H:
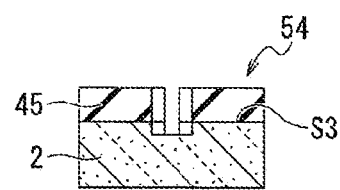
FIG. 17H is a diagram illustrating a cross-sectional configuration taken along line P-P of FIG. 17G.
Figure 17I:
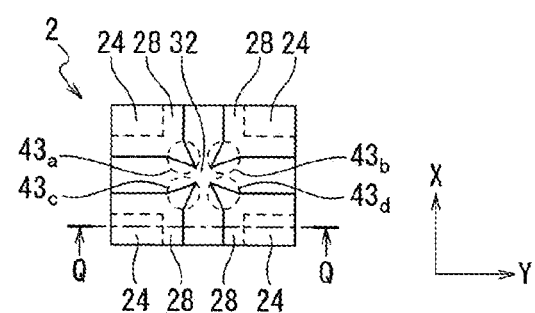
FIG. 17I is a diagram illustrating a flow of processing of manufacturing a solid-state imaging device according to a modification example.
Figure 17J:
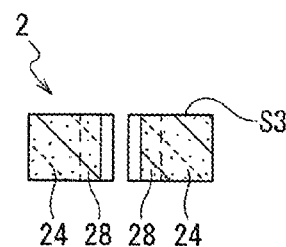
FIG. 17J is a diagram illustrating a cross-sectional configuration taken along line Q-Q of FIG. 17I.

Subsequently, the BARC layer 50 and the photoresist layer 51 are stacked in this order on the hard mask 49, as illustrated in FIG. 15D. In this case, the V-shaped groove portion 52 is formed in the BARC layer 50. Subsequently, exposure and development are performed on the photoresist layer 51 through the mask having the opening at the portion corresponding to the groove portion 30 extending in the X direction. As the mask, a mask having openings having a narrowed width at a portion corresponding to the central position of the intersection portion 32 is used. Accordingly, the resist pattern 53 that is provided at the portion corresponding to the groove portion 30 extending in the X direction and has an opening having a narrowed width at the portion corresponding to the central position of the intersection portion 32 is formed with respect to the photoresist layer 51, as illustrated in FIGS. 17E and 17F. Subsequently, etching is performed on the BARC layer 50 and the TEOS layer 45 via the resist pattern 53 and then, the photoresist layer 51 and the BARC layer 50 are removed so that the hard mask 54 having openings is formed at the portion corresponding to the groove portion 30 extending in the X direction, in addition to the portion corresponding to the groove portion 30 extending in the Y direction, as illustrated in FIGS. 17G and 17H. That is, as the hard mask 54, a mask having openings corresponding to all the groove portions 30 extending in both the X and Y directions go straight to each other is formed. Subsequently, the substrate 2 is etched through the formed hard mask 54 to form the groove portion 30 extending in both the X and Y directions on the substrate 2, as illustrated in FIGS. 17I and 17J. Accordingly, the intersection portion 32 having the convex portion 44 at the corner portions 43a, 43b, 43c, and 43d is formed. In FIGS. 17I and 17J, an isosceles triangle shaped convex portion 44 having a protruding apex is shown as an example.

Figure 18:
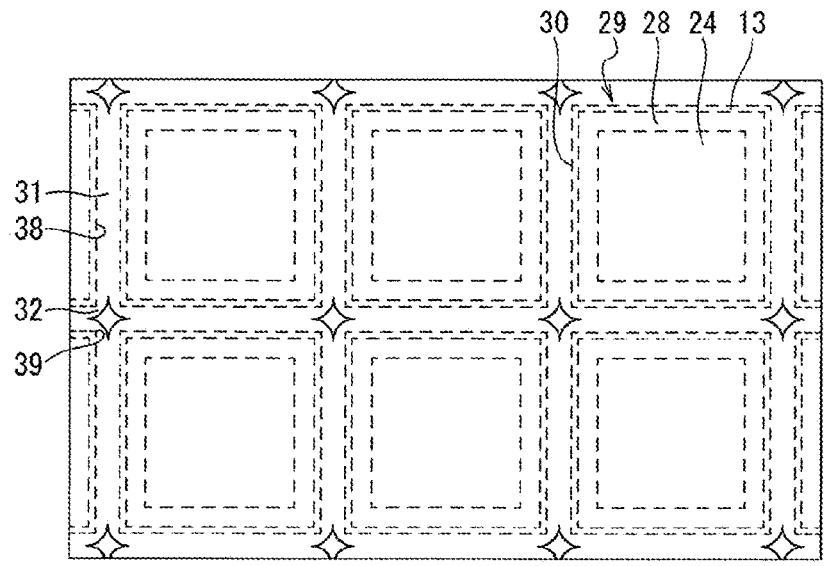
FIG. 18 is a diagram illustrating a planar layout of a fixed charge film of a solid-state imaging device according to a modification example.

(2) An example in which not all but only some of the open ends of the groove portions 30 are closed by the second fixed charge film 14 with the void 35 left inside the groove portion 30 in the solid-state imaging device 1 according to the modification example of the first embodiment will be described. FIG. 18 is a diagram illustrating a planar layout of the second fixed charge film 14 according to the modification example. In FIG. 18, portions corresponding to FIG. 3 are denoted by the same reference signs, and duplicate description will be omitted.

As illustrated in FIG. 18, in the solid-state imaging device 1 according to the modification example, at least some of the open ends of the plurality of intersection portions 32 in which the groove portions 30 intersect each other are not closed by the second fixed charge film 14. That is, open ends 38 of the groove portions 30 (open ends of the straight portions 31) other than the intersection portions 32 are all closed by the second fixed charge film 14 with the void 35 left inside the straight portions 31. However, closing of open ends 39 of the intersection portion 32 by the second fixed charge film 14 is performed only on some of the open ends or is not performed on any of the open ends.

Figure 19:
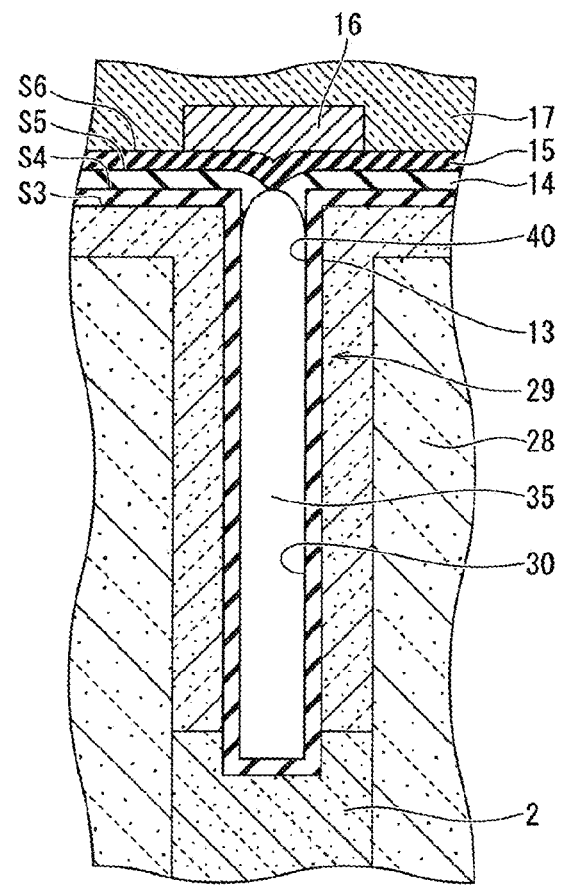
FIG. 19 is a diagram illustrating a cross-sectional configuration of an element isolation portion of the solid-state imaging device according to the first embodiment.

At the open ends 39 not closed by the second fixed charge film 14, a part of the second fixed charge film 14 enters the groove portion 30 so that a sidewall surface 40 on the open end side of the groove portion 30 is covered, as illustrated in FIG. 19. A film thickness of the second fixed charge film 14 which covers the sidewall surface 40 on the open end 39 side of the groove portion 30 is also larger on the open end 39 side of the groove portion 30 than on the back side (bottom surface side). Accordingly, the second fixed charge film 14 has a shape protruding toward an inner wall surface of the groove portion 30 from the opening at a center in a width direction of the open end 39, and the open end 39 of the groove portion 30 is narrowed by the second fixed charge film 14. The open end 39 narrowed by the second fixed charge film 14 is closed by the insulation film 15 with the void 35 left inside the groove portion 30.

Here, a maximum width of the open end 39 of the intersection portion 32 is larger than a maximum width of the open end of the straight portion 31. Therefore, it is necessary to reduce all groove portion widths of the groove portion 30 in order to close all the open ends 39 of the intersection portion 32 with the second fixed charge film 14. However, when all the groove portion widths of the groove portions 30 are reduced, the number of steps of forming the groove portions 30 may increase, and the manufacturing cost may increase.

On the other hand, in the solid-state imaging device 1 according to the modification example, at least some of the open ends 39 of the plurality of intersection portions 32 in which the groove portions 30 intersect each other are not closed by the second fixed charge film 14. Therefore, it is not necessary to reduce all the groove portion widths of the groove portions 30, and it is possible to curb an increase in the number of steps of forming the groove portions 30, and to curb the increase in the manufacturing cost.

2. Second Embodiment: Solid-State Imaging Device

[2-1 Configuration of Main Portions]

Figure 20:
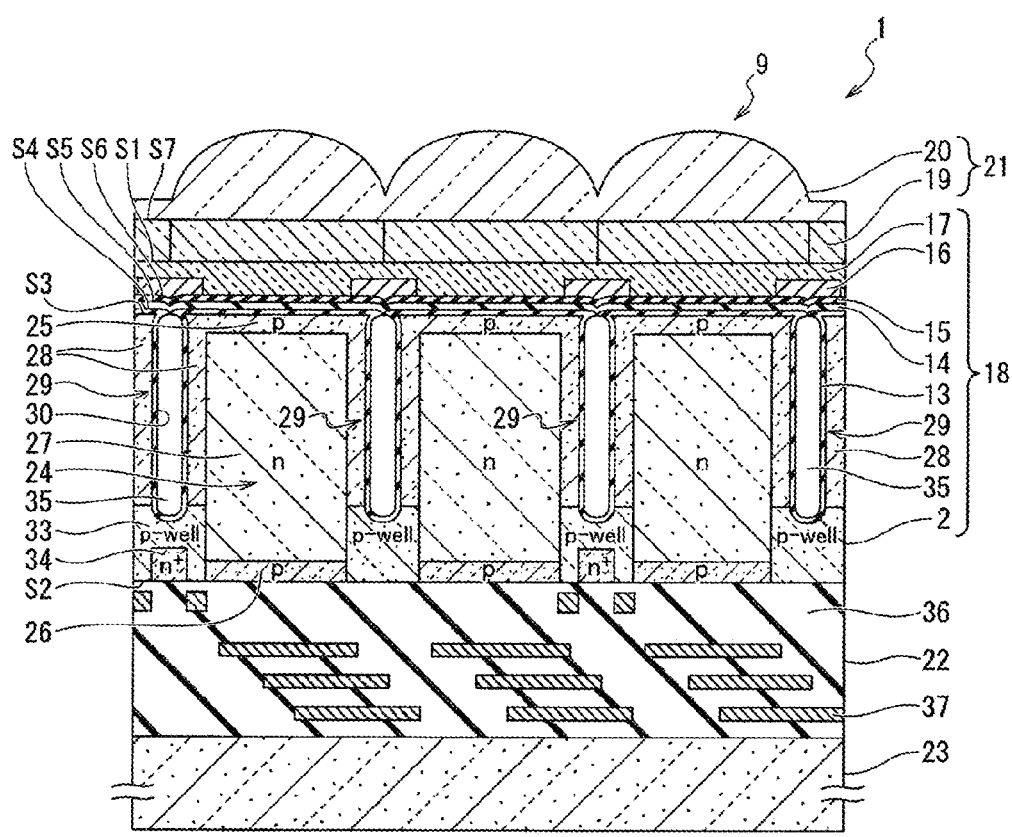
FIG. 20 is a diagram illustrating a cross-sectional configuration of a pixel region of a solid-state imaging device according to a second embodiment of the present disclosure.
Figure 21A:
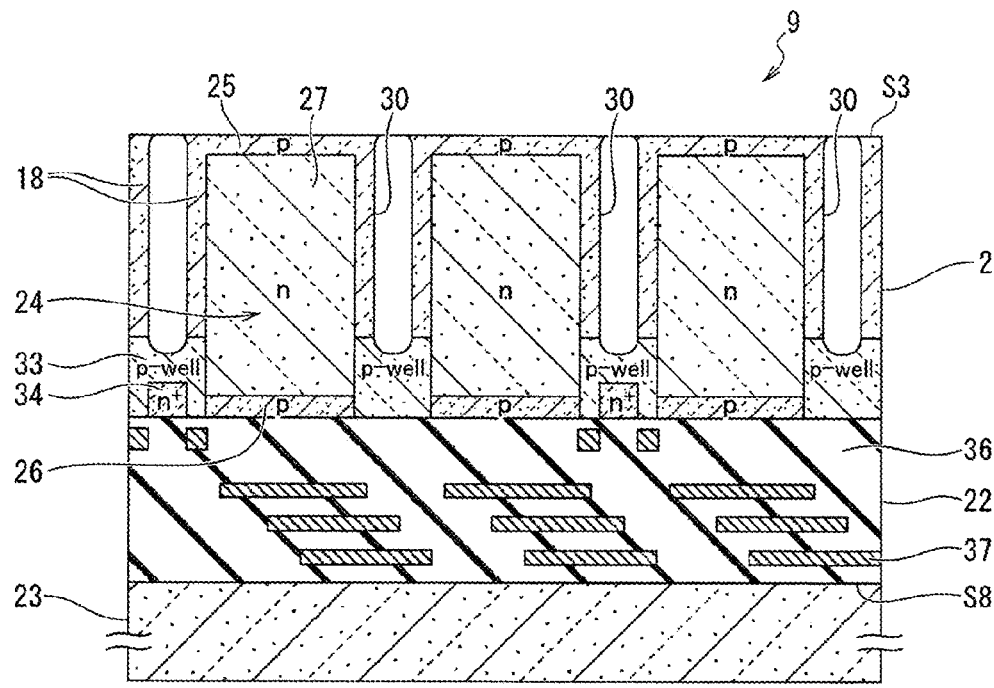
FIG. 21A is a diagram illustrating a flow of processing of manufacturing the solid-state imaging device according to the second embodiment.
Figure 21B:
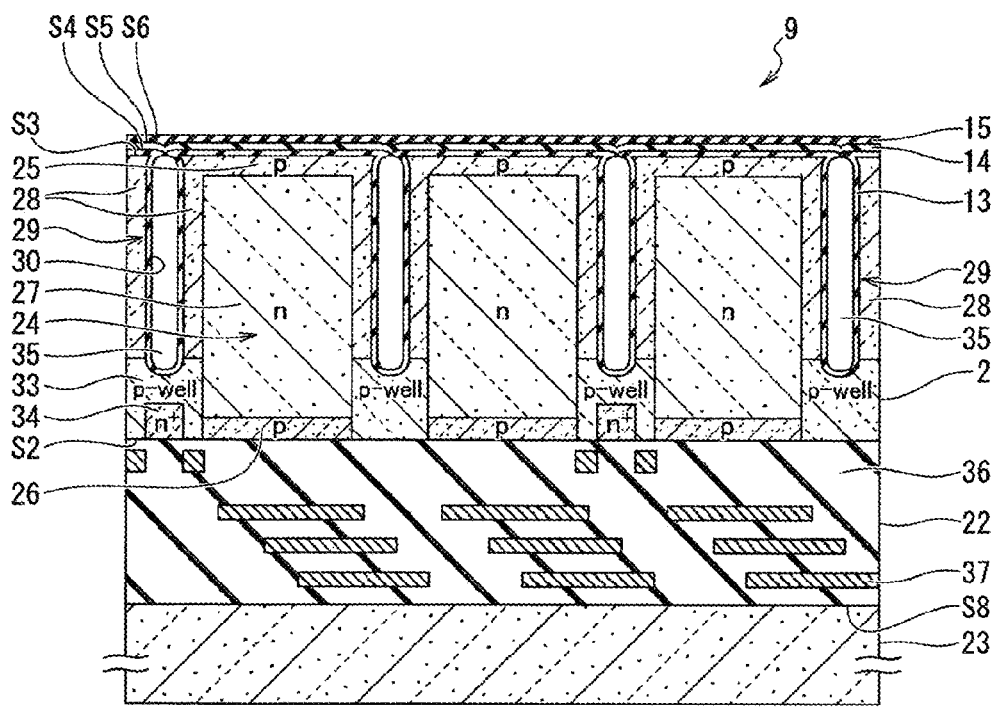
FIG. 21B is a diagram illustrating a flow of processing of manufacturing the solid-state imaging device according to the second embodiment.

Next, a solid-state imaging device according to the second embodiment of the present disclosure will be described. Since an overall configuration of the solid-state imaging device of the second embodiment is the same as that in FIG. 1, the illustration is omitted. FIGS. 20, 21A and 21B are cross-sectional configuration views of main parts of the solid-state imaging device 1 of the embodiment. In FIGS. 20, 21A and 21B, portions corresponding to FIG. 2 are denoted by the same reference signs and duplicate description will be omitted.

In the solid-state imaging device 1 of the second embodiment, a configuration of the element isolation portion 29 differs from that of the solid-state imaging device 1 of the first embodiment. In the second embodiment, the open end 41 of the groove portion 30 has an overhang shape in which the open end 41 of the groove portion 30 is narrower than the inside of the groove portion 30 at least on the open end side of the groove portion 30, as illustrated in FIG. 20. A cross-sectional shape of the groove portion 30 when the groove portion 30 is cut in a depth direction may be, for example, an elliptical shape in which an opening side and a back side are narrow and a center portion side is wide, and may be a shape with a constant width in which only an opening side is narrow and a center portion and a back side are wide (a shape in which a triangle and a square are combined).

The first fixed charge film 13 closes the open end 41 having the overhang shape of the groove portion 30 so that the void 35 is left inside the groove portion 30. The thickness of the first fixed charge film 13 is set to, for example, a thickness of about half the groove portion width of the open end 41 so that the entire inside of the groove portion 30 is not completely filled with the first fixed charge film 13 and the open end 41 of the groove portion 30 is closed. For example, when the groove portion width of the open end 41 is about 30 nm, the thickness of the first fixed charge film 13 is about 15 nm.

Further, in the second fixed charge film 14, since the open end 41 of the groove portion 30 is closed by the first fixed charge film 13, only the back surface S4 side (the entirety on the light reception surface side) of the first fixed charge film 13 is covered. Further, the first fixed charge film 13 and the second fixed charge film 14 can be formed of the same materials as the materials of the first fixed charge film 13 and the second fixed charge film 14 used in the first embodiment.

[2-2 Method of Manufacturing Solid-State Imaging Device]

FIGS. 21A and 21B illustrate processing of manufacturing the solid-state imaging device 1 of the second embodiment. Since the steps up to the step of adhering the support substrate 23 are the same as those of the first embodiment, duplicate description will be omitted. After the support substrate 23 is adhered, selective etching is performed in the depth direction from the back surface S3 side of the substrate 2 (a direction from the back surface S3 to the front surface S2) at the boundary of each pixel 9 of the substrate 2, so that, the groove portion 30 having a desired depth is formed, as illustrated in FIG. 21A. As a method for forming the groove portion 30, for example, a method of providing a hard mask (not illustrated) having a desired opening on the back surface S3 of the substrate 2 and performing etching through this hard mask can be adopted. In the etching step of the groove portion 30, an etching condition is set so that bowing occurs and the open end 41 of the groove portion 30 has the overhang shape. Thus, the etching condition is optimized such that the open end 41 of the groove portion 30 narrower than the inside of the groove portion 30 can be formed. Accordingly, the groove portion 30 illustrated in FIG. 20 is closed only by the first fixed charge film 13 with the void 35 left inside the groove portion 30. The internal space of the void 35 is formed in a grid pattern extending along the groove portion 30, as in FIG. 3.

Subsequently, the hard mask used for processing of the groove portion 30 is removed. The sidewall surface and the bottom surface of the groove portion 30 and the entirety on the back surface S3 side (the entirety on the light reception surface side) of the substrate 2 are continuously covered using the ALD method or the CVD method, and the first fixed charge film 13 is formed so that the open end 41 of the groove portion 30 is closed as illustrated in FIG. 21B. In the step of forming the first fixed charge film 13, a film forming condition is set so that the open end 41 side of the groove portion 30 is closed before the inside of the groove portion 30 is completely embedded by the first fixed charge film 13. Thus, the film forming condition is optimized such that the element isolation portion 29 having the void 35 can be formed. Accordingly, the open end 41 of the groove portion 30 illustrated in FIG. 20 is closed by the first fixed charge film 13 with the void 35 left inside the groove portion 30. The internal space of the void 35 is formed in a grid pattern extending along the groove portion Subsequently, a PVD method or a CVD method is used to form the second fixed charge film 14 so that the entirety on the back surface S4 side (the entirety on the light reception surface side) of the first fixed charge film 13 is covered. Thereafter, the solid-state imaging device 1 of the second embodiment illustrated in FIG. 20 is completed through the same step as that in the first embodiment.

As described above, in the solid-state imaging device 1 of the second embodiment, the open end 41 of the groove portion 30 has the overhang shape in which the open end 41 is narrower than the inside of the groove portion 30. Therefore, the groove portion 30 provided between the adjacent photoelectric conversion portions 24 can be closed by the first fixed charge film 13 with the void 35 left more reliably inside the groove portion 30. Therefore, it is possible to increase a difference between the refractive index of the substrate 2 (for example, 3.9 in the case of silicon (Si)) and the refractive index of the void 35 (for example, 1.0 in the case of being filled with air), it is possible to obtain sufficient reflection characteristics in the groove portion 30 between the adjacent photoelectric conversion portions 24, it is difficult for light to be transmitted through the groove portion 30, and it is possible to curb optical color mixing, as in the first embodiment.

[2-3 Modification Example]

Figure 22:
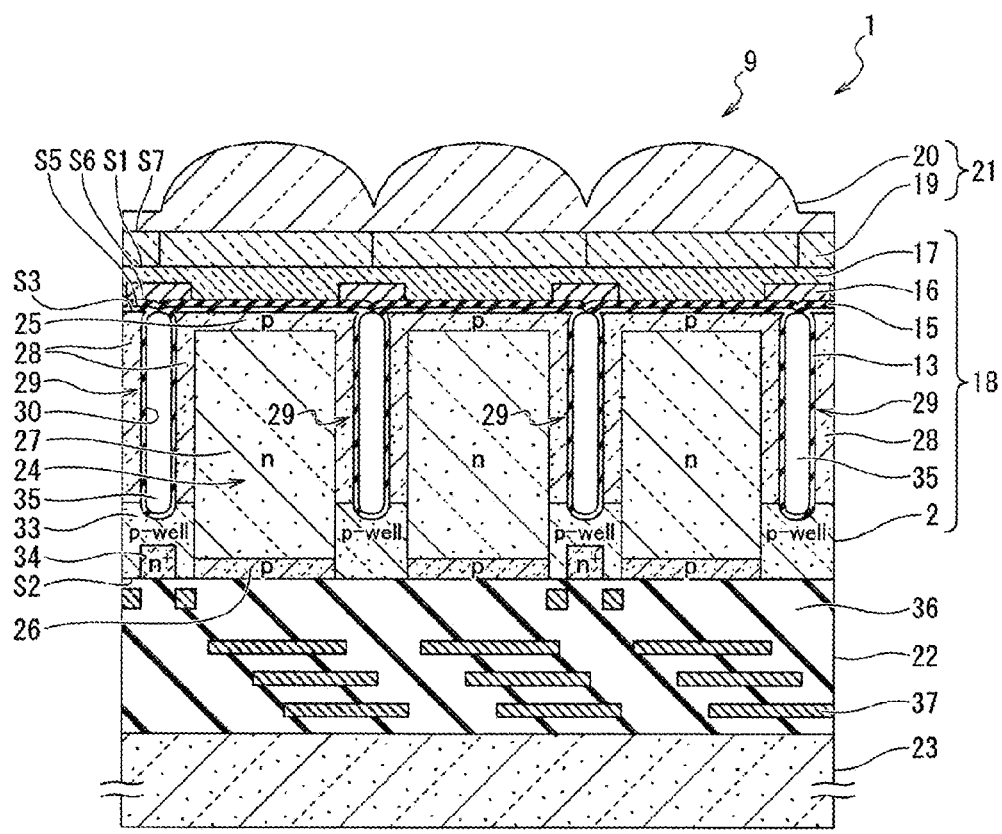
FIG. 22 is a cross-sectional view illustrating a cross-sectional configuration of a pixel region of a solid-state imaging device according to a modification example.

FIG. 22 is a cross-sectional configuration diagram of a solid-state imaging device 1 according to a modification example of the second embodiment. In FIG. 22, portions corresponding to FIG. 20 are denoted by the same reference signs, and duplicate description will be omitted. The solid-state imaging device 1 according to the modification example differs from that according to the second embodiment in that the second fixed charge film 14 is omitted. This can reduce the number of steps of forming the second fixed charge film 14 and manufacturing cost.

Further, although the back-illuminated CMOS-type solid-state imaging device has been described as an example in the solid-state imaging device 1 according to the first and second embodiments, the present disclosure can also be applied to a back-illuminated CCD-type solid-state imaging device. In this case, the element isolation portion 29 between the photoelectric conversion portions 24 is formed with the void 35 left in the groove portion 30, such that the same effect as that in the first and second embodiments can be obtained.

Further, although a case in which negative charge (electrons) is used as the signal charge has been described as an example in the solid-state imaging device 1 according to the first and second embodiments, the present disclosure can also be applied to a case in which a positive charge (hole) is used as the signal charges. When holes are used as the signal charge, a material having positive fixed charge may be used as the first fixed charge film 13 and the second fixed charge film 14, and a p-type region and n-type region in the substrate 2 may be configured in reverse. That is, a material having the same charge as the signal charge as fixed charge may be used for the first fixed charge film 13 and the second fixed charge film 14.

Further, the present disclosure is not limited to a solid-state imaging device that detects distribution of an amount of incident light of visible light and captures an image like the solid-state imaging devices 1 according to the first and second embodiments. For example, the present disclosure can be applied to a solid-state imaging device that captures distribution of an incidence amount of infrared rays, X-rays, particles, or the like as an image. Further, the present disclosure can also be applied to all solid-state imaging devices (physical quantity distribution detection devices) such as fingerprint detection sensors that detect distribution of other physical quantities such as pressure or capacitance and capture an image.

Further, the present disclosure is not limited to a solid-state imaging device that scans each pixel 9 of the pixel region 3 in order in units of rows and reads a pixel signal from each pixel 9, like the solid-state imaging devices 1 according to the first and second embodiments. For example, the present disclosure can also be applied to an XY address type solid-state imaging device that selects any pixel 9 in units of pixels and reads a signal from the selected pixel 9 in units of pixels.

Further, the present disclosure is not limited to the solid-state imaging device in which an interface (light reception surface side interface) of the p-type semiconductor region 25 above the n-type semiconductor regions 27 is flat, as in the solid-state imaging device 1 according to the first and second embodiments. For example, the present disclosure can also be applied to a solid-state imaging device having a reflection prevention portion 42 having a so-called moth-eye structure in which an inverted pyramid-shaped depressed portion is formed so that an interface (an interface on the light reception surface side) of the p-type semiconductor region 25 prevents reflection of incident light, as illustrated in FIG. 23.

Figure 23:
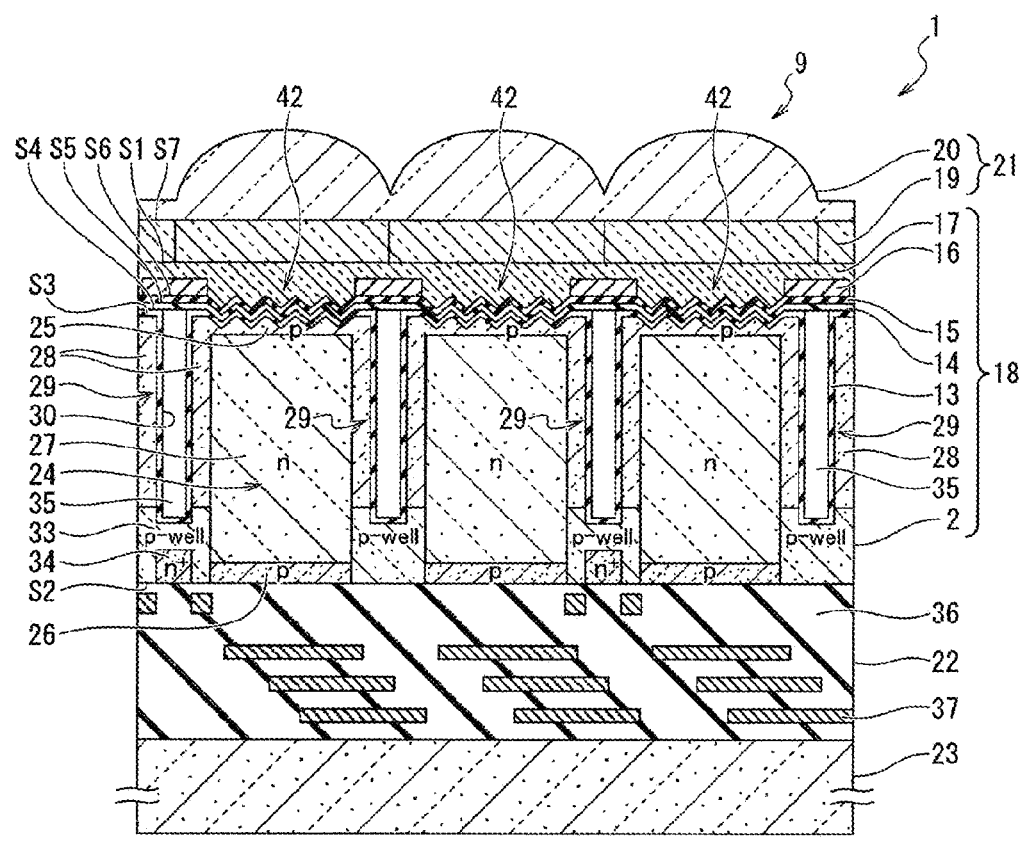
FIG. 23 is a cross-sectional view illustrating a cross-sectional configuration of a pixel region of a solid-state imaging device according to a modification example.
Figure 24:
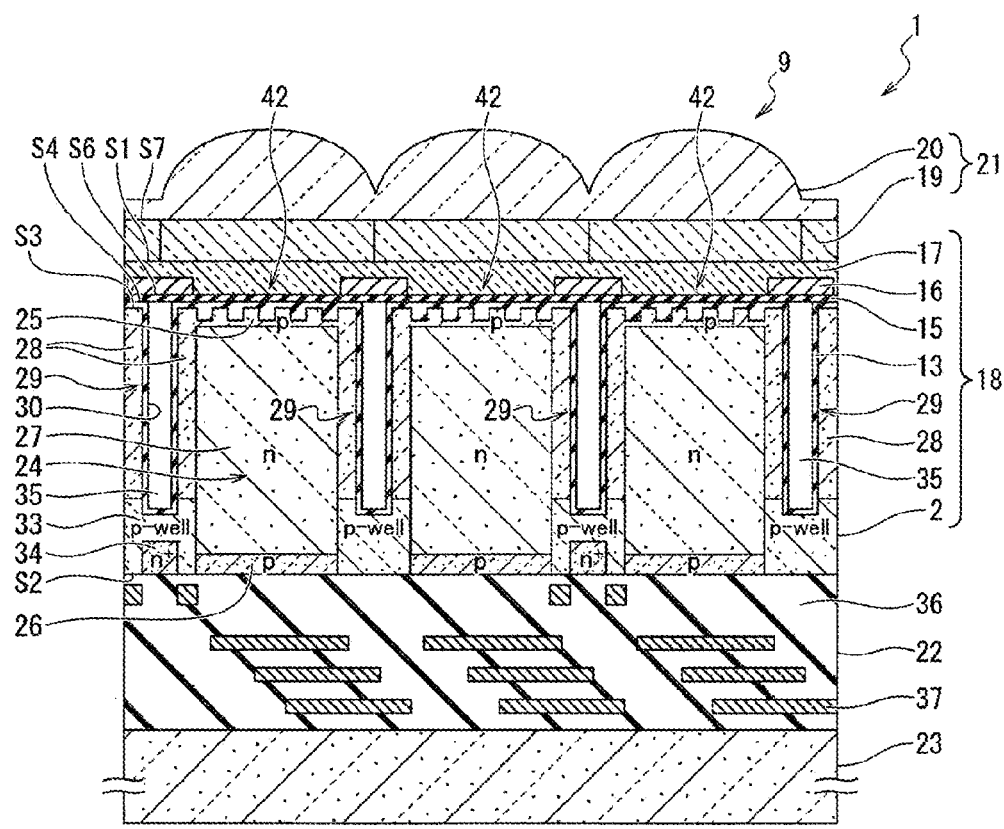
FIG. 24 is a cross-sectional view illustrating a cross-sectional configuration of a pixel region of a solid-state imaging device according to a modification example.
Figure 25:
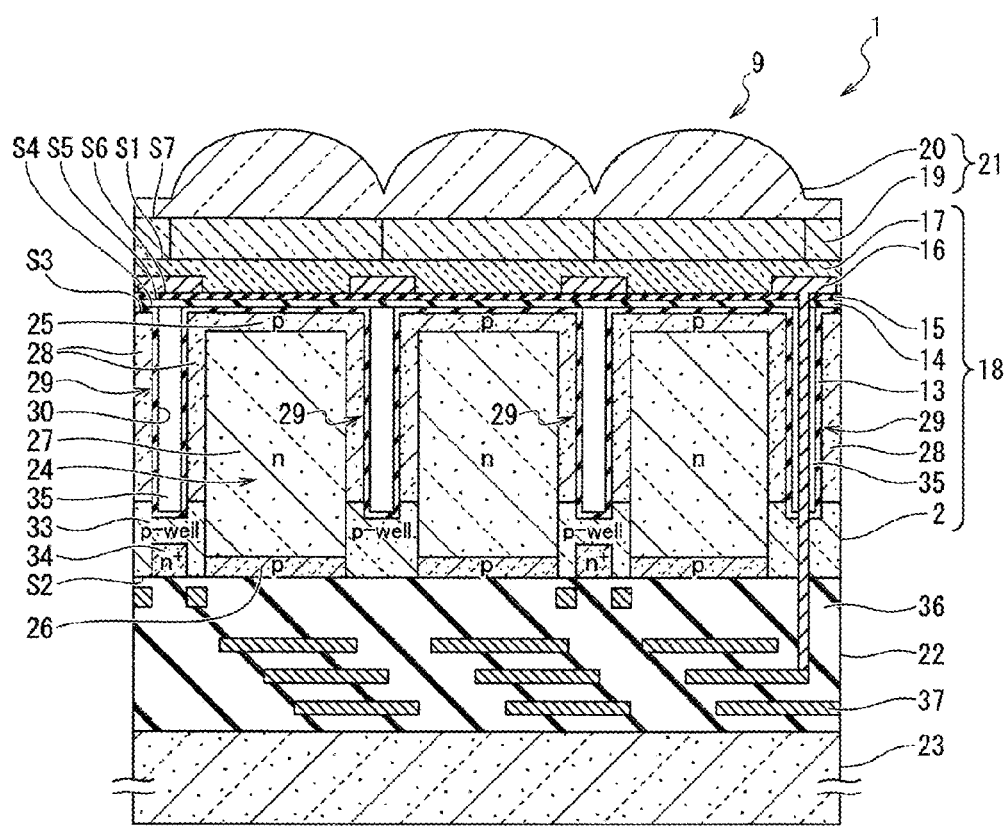
FIG. 25 is a cross-sectional view illustrating a cross-sectional configuration of a pixel region of a solid-state imaging device according to a modification example.

Further, for example, a rectangular depressed portion may be provided instead of the inverted pyramid-shaped depressed portion of FIG. 23, and the inside of the depressed portion may be filled with the first fixed charge film 13, as illustrated in FIG. 25. In this case, the second fixed charge film 14 may be omitted, and the open end of the groove portion 30 may be closed by the insulation film 15.

Further, the present disclosure is not limited to the solid-state imaging device in which an interface (light reception surface side interface) of the p-type semiconductor region 25 above the n-type semiconductor region 27 is flat, as in the solid-state imaging device 1 according to the first and second embodiments. For example, the present disclosure can also be applied to a solid-state imaging device including the element isolation portion 29 penetrating the substrate 2 in a part (for example, an edge) of the pixel region, and the light shielding film 16 exposed on the front surface S2 side of the substrate 2 in the element isolation portion 29, as illustrated in FIG. 25.

3. Third Embodiment: Electronic Apparatus

Next, an electronic apparatus according to the third embodiment of the present disclosure will be described. FIG. 26 is a schematic configuration diagram of the electronic apparatus 100 according to the third embodiment of the present disclosure.

The electronic apparatus 100 according to the third embodiment includes a solid-state imaging device 101, an optical lens 102, a shutter device 103, a drive circuit 104, and a signal processing circuit 105. The electronic apparatus 100 of the third embodiment shows an embodiment in which the solid-state imaging device 1 according to the first embodiment of the present disclosure is used for electronic apparatuses (for example, a camera) as the solid-state imaging device 101.

The optical lens 102 forms an image of image light (the incident light 106) from the subject on the imaging surface of the solid-state imaging device 101. Accordingly, the signal charge is accumulated in the solid-state imaging device 101 for a certain period of time. The shutter device 103 controls a light irradiation period and a light shielding period of the solid-state imaging device 101. The drive circuit 104 supplies a drive signal for controlling a transfer operation of the solid-state imaging device 101 and a shutter operation of the shutter device 103. Signal transfer of the solid-state imaging device 101 is performed by the drive signal (timing signal) supplied from the drive circuit 104. The signal processing circuit 105 performs various signal processing on a signal (pixel signal) output from the solid-state imaging device 101. A video signal subjected to signal processing is stored in a storage medium such as a memory or output to a monitor.

With such a configuration, in the electronic apparatus 100 of the third embodiment, since optical color mixing is curbed in the solid-state imaging device 101, it is possible to improve image quality of the video signal.

The electronic apparatus 100 to which the solid-state imaging device 1 can be applied is not limited to a camera, but can also be applied to another electronic apparatus. For example, the solid-state imaging device 1 may be applied to an imaging device such as a camera module for mobile devices such as mobile phones. Further, although the solid-state imaging device 1 according to the first embodiment is used for the electronic apparatus as the solid-state imaging device 101 in the third embodiment, but other configurations may be adopted. For example, the solid-state imaging device 1 according to the second embodiment or the solid-state imaging device 1 according to the modification example may be used for electronic apparatuses.

The present technology can have the following configurations.

(1) A solid-state imaging device including:
a substrate;
a plurality of photoelectric conversion portions formed on the substrate;
groove portions provided between the adjacent photoelectric conversion portions; and
a fixed charge film which covers a sidewall surface and a bottom surface of the groove portions, and a light reception surface side of the substrate and which contains at least one of hafnium, aluminum, zirconium, tantalum, and titanium, wherein
at least some of open ends of the groove portion are closed by the fixed charge film with a void left inside the groove portion.

(2) The solid-state imaging device according to (1), wherein the fixed charge film includes a first fixed charge film and a second fixed charge film, the first fixed charge film continuously covers the sidewall surface and the bottom surface of the groove portion and the entirety on the light reception surface side of the substrate such that the sidewall surface and the bottom surface forms, inside the groove portion, a groove-shaped space surrounded by the first fixed charge film, and the second fixed charge film closes the open end of the groove portion with a void left inside the groove portion and continuously covers the entirety on the light reception surface side of the first fixed charge film.

(3) The solid-state imaging device according to (2), further including a depressed portion extending along the groove portion on a surface of the second fixed charge film on the light reception surface side.

(4) The solid-state imaging device according to (2) or (3), wherein the second fixed charge film also covers the sidewall surface on the open end side of the groove portion, and a thickness of the second fixed charge film which covers the sidewall surface on the open end side of the groove portion is larger on the open end side of the groove portion than on the back side.

(5) The solid-state imaging device according to (1), wherein at least some of open ends of a plurality of intersection portions in which the groove portions intersect each other are not closed by the fixed charge film.

(6) The solid-state imaging device according to any one of (1) to (5), wherein the open end of the groove portion has an overhang shape in which the open end is narrower than the inside of the groove portion.

(7) The solid-state imaging device according to any one of (1) to (6), further including an insulation film which continuously covers the entirety of the fixed charge film on the light reception surface side and which contains at least one of silicon oxide, silicon nitride, and silicon oxynitride.

(8) The solid-state imaging device according to any one of (1) to (7), wherein a distance between corner portions located in diagonal directions with respect to respective directions in which the groove portions extend among four corner portions formed on sidewall surfaces of the groove portions intersecting each other at an intersection portion in which the groove portions intersect each other is equal to or smaller than 2.5 times a width of the groove portion.

(9) The solid-state imaging device according to (8), wherein the distance between the corner portions is greater than 0 times and equal to or smaller than 2.5 times the width of the groove portion.

(10) The solid-state imaging device according to any one of (1) to (9), wherein a distance between corner portions located in diagonal directions with respect to respective directions in which the groove portions extend among four corner portions formed on sidewall surfaces of the groove portions intersecting each other at an intersection portion in which the groove portions intersect each other is equal to or smaller than 250 nm.

(11) The solid-state imaging device according to (10), wherein the distance between the corner portions is greater than 0 nm and equal to or smaller than 250 nm.

(12) The solid-state imaging device according to any one of (1) to (11), wherein at least one of corner portions located in diagonal directions with respect to respective directions in which the groove portions extend among four corner portions formed on sidewall surfaces of the groove portions intersecting each other at an intersection portion in which the groove portions intersect each other is rounded in an arc shape, and a radius of curvature of the arc is equal to or smaller than 20 nm.

(13) The solid-state imaging device according to (12), wherein at least one of the four corner portions is rounded in an arc shape, and the radius of curvature of the arc is equal to or greater than 1 nm and equal to or smaller than 20 nm.

(14) The solid-state imaging device according to any one of (1) to (13), wherein at least one of corner portions located in diagonal directions with respect to respective directions in which the groove portions extend among four corner portions formed on sidewall surfaces of the groove portions intersecting each other at an intersection portion in which the groove portions intersect each other forms a convex portion protruding inward into the intersection portion.

(15) The solid-state imaging device according to (14), wherein the shape of the convex portion is at least one of an elliptical shape, a perfect circular shape, and a polygonal shape in a plan view.

(16) An electronic apparatus including:
a solid-state imaging device including a substrate, a plurality of photoelectric conversion portions formed on the substrate, groove portions provided between the adjacent photoelectric conversion portions, and a fixed charge film which covers a sidewall surface and a bottom surface of the groove portions, and a light reception surface side of the substrate and which contains at least one of hafnium, aluminum, zirconium, tantalum, and titanium;
an optical lens that forms an image of image light from a subject on an imaging surface of the solid-state imaging device; and
a signal processing circuit that performs signal processing on a signal output from the solid-state imaging device, wherein
at least some of open ends of the groove portion are closed by the fixed charge film with a void left inside the groove portion.

REFERENCE SIGNS LIST

1 Solid-state imaging device
2 Substrate
3 Pixel region
4 Vertical drive circuit
5 Column signal processing circuit
6 Horizontal drive circuit
7 Output circuit
8 Control circuit
9 Pixel
10 Pixel drive wiring
11 Vertical signal line
12 Horizontal signal line
13 First fixed charge film
14 Second fixed charge film
15 Insulation film
16 Light shielding film
17 Flattening film
18 Light reception layer
19 Color filter layer
20 On-chip lens
21 Condensing layer
22 Wiring layer
23 Support substrate
24 Photoelectric conversion portion
25, 26 P-type semiconductor region
27 N-type semiconductor region
28 Pixel isolation layer
29 Element isolation portion
30 Groove portion
31 Straight portion
32 Intersection portion
33 Well layer
34 Floating diffusion portion
35 Void
36 Interlayer insulation film
37 Wiring
38, 39 Open end
40 Sidewall
41 Open end
42 Reflection prevention portion
100 Electronic apparatus
101 Solid-state imaging device
102 Optical lens
103 Shutter device
104 Drive circuit
105 Signal processing circuit
106 Incident light
S1 Back surface
S2 Front surface
S4 Back surface
S5 Back surface
S6 Back surface
S7 Back surface
S8 Outermost surface

What is claimed is:
1. A solid-state imaging device, comprising:
a substrate;
a plurality of photoelectric conversion portions formed on the substrate;
groove portions provided between adjacent photoelectric conversion portions;
a fixed charge film which covers a sidewall surface and a bottom surface of each of the groove portions; and
a light reception surface side of the substrate which contains at least one of hafnium, aluminum, zirconium, tantalum, and titanium,
wherein at least some of open ends of the groove portions are closed by the fixed charge film with a void left inside the groove portions,
wherein at least one corner portion among four corner portions located in diagonal directions with respect to respective directions in which the groove portions extend, formed on sidewall surfaces of the groove portions intersecting each other at an intersection portion in which the groove portions intersect each other is rounded in an arc shape, and wherein a radius of curvature of the arc is equal to or smaller than 20 nm.

2. The solid-state imaging device according to claim 1, wherein
the fixed charge film includes a first fixed charge film and a second fixed charge film,
the first fixed charge film continuously covers the sidewall surface and the bottom surface of each of the groove portions and an entirety on the light reception surface side of the substrate such that the sidewall surface and the bottom surface forms, inside each of the groove portions, a groove-shaped space surrounded by the first fixed charge film, and
the second fixed charge film closes the open end of each of the groove portions with a void left inside the groove portions and continuously covers the entirety on the light reception surface side of the first fixed charge film.

3. The solid-state imaging device according to claim 2, further comprising a depressed portion extending along the groove portions on a surface of the second fixed charge film on the light reception surface side.

4. The solid-state imaging device according to claim 1, wherein at least some of open ends of a plurality of intersection portions in which the groove portions intersect each other are not closed by the fixed charge film.

5. The solid-state imaging device according to claim 1, wherein the at least some of open ends of the groove portions have an overhang shape in which the at least some of open ends is narrower than the inside of the groove portions.

6. The solid-state imaging device according to claim 1, further comprising an insulation film which continuously covers an entirety of the fixed charge film on the light reception surface side is and which contains at least one of silicon oxide, silicon nitride, and silicon oxynitride.

7. The solid-state imaging device according to claim 1, wherein a distance between the corner portions among the four corner portions located in the diagonal directions with respect to the respective directions in which the groove portions extend, formed on the sidewall surfaces of the groove portions intersecting each other at the intersection portion in which the groove portions intersect each other is equal to or smaller than 2.5 times a width of the groove portion.

8. The solid-state imaging device according to claim 7, wherein the distance between the corner portions is greater than 0 times and equal to or smaller than 2.5 times the width of the groove portion.

9. The solid-state imaging device according to claim 1, wherein a distance between the corner portions among the four corner portions located in the diagonal directions with respect to the respective directions in which the groove portions extend, formed on the sidewall surfaces of the groove portions intersecting each other at the intersection portion in which the groove portions intersect each other is equal to or smaller than 250 nm.

10. The solid-state imaging device according to claim 9, wherein the distance between the corner portions is greater than 0 nm and equal to or smaller than 250 nm.

11. The solid-state imaging device according to claim 1, wherein the at least one of the four corner portions is rounded in the arc shape and the radius of curvature of the arc is equal to or greater than 1 nm and equal to or smaller than 20 nm.

12. The solid-state imaging device according to claim 1, wherein the at least one corner portion among the four corner portions located in the diagonal directions with respect to the respective directions in which the groove portions extend, formed on the sidewall surfaces of the groove portions intersecting each other at the intersection portion in which the groove portions intersect each other forms a convex portion protruding inward into the intersection portion.

13. The solid-state imaging device according to claim 12, wherein the shape of the convex portion is at least one of an elliptical shape, a perfect circular shape, and a polygonal shape in a plan view.

14. An electronic apparatus, comprising:
a solid-state imaging device comprising:
a substrate;
a plurality of photoelectric conversion portions formed on the substrate;
groove portions provided between adjacent photoelectric conversion portions;
a fixed charge film which covers a sidewall surface and a bottom surface of the groove portions; and
a light reception surface side of the substrate and which contains at least one of hafnium, aluminum, zirconium, tantalum, and titanium,
wherein at least some of open ends of the groove portions are closed by the fixed charge film with a void left inside the groove portions,
wherein at least one corner portion among four corner portions located in diagonal directions with respect to respective directions in which the groove portions extend, formed on sidewall surfaces of the groove portions intersecting each other at an intersection portion in which the groove portions intersect each other is rounded in an arc shape, and
wherein a radius of curvature of the arc is equal to or smaller than 20 nm;
an optical lens that forms an image of image light from a subject on an imaging surface of the solid-state imaging device; and
a signal processing circuit that performs signal processing on a signal output from the solid-state imaging device.

15. The electronic apparatus according to claim 14, wherein
the fixed charge film includes a first fixed charge film and a second fixed charge film,
the first fixed charge film continuously covers the sidewall surface and the bottom surface of each of the groove portions and an entirety on the light reception surface side of the substrate such that the sidewall surface and the bottom surface forms, inside each of the groove portions, a groove-shaped space surrounded by the first fixed charge film, and
the second fixed charge film closes the open end of each of the groove portions with a void left inside the groove portions and continuously covers the entirety on the light reception surface side of the first fixed charge film.

16. The electronic apparatus according to claim 15, further comprising a depressed portion extending along the groove portions on a surface of the second fixed charge film on the light reception surface side.

17. The electronic apparatus according to claim 14, wherein at least some of open ends of a plurality of intersection portions in which the groove portions intersect each other are not closed by the fixed charge film.

18. The electronic apparatus according to claim 14, wherein the at least some of open ends of the groove portions have an overhang shape in which the at least some of open ends is narrower than the inside of the groove portions.

19. The electronic apparatus according to claim 14, further comprising an insulation film which continuously covers an entirety of the fixed charge film on the light reception surface side is and which contains at least one of silicon oxide, silicon nitride, and silicon oxynitride.

20. The electronic apparatus according to claim 14, wherein a distance between the corner portions among the four corner portions located in the diagonal directions with respect to the respective directions in which the groove portions extend, formed on the sidewall surfaces of the groove portions intersecting each other at the intersection portion in which the groove portions intersect each other is equal to or smaller than 2.5 times a width of the groove portion.

* * * * *